United States Patent
Leonberger et al.

(10) Patent No.: US 10,527,786 B2
(45) Date of Patent: *Jan. 7, 2020

(54) POLYMER MODULATOR AND LASER INTEGRATED ON A COMMON PLATFORM AND METHOD

(71) Applicants: Frederick J Leonberger, Sarasota, FL (US); Michael Lebby, San Francisco, CA (US); Richard Becker, Cupertino, CA (US)

(72) Inventors: Frederick J Leonberger, Sarasota, FL (US); Michael Lebby, San Francisco, CA (US); Richard Becker, Cupertino, CA (US)

(73) Assignee: Lightwave Logic Inc., Englewood, CO (US)

( * ) Notice: Subject to any disclaimer, the term of this patent is extended or adjusted under 35 U.S.C. 154(b) by 6 days.

This patent is subject to a terminal disclaimer.

(21) Appl. No.: 15/692,080

(22) Filed: Aug. 31, 2017

(65) Prior Publication Data
US 2019/0064436 A1    Feb. 28, 2019

(51) Int. Cl.
*G02B 6/12* (2006.01)
*G02B 6/02* (2006.01)
(Continued)

(52) U.S. Cl.
CPC ......... *G02B 6/12004* (2013.01); *G02B 6/021* (2013.01); *G02B 6/02066* (2013.01);
(Continued)

(58) Field of Classification Search
CPC .... H01S 5/026; H01S 5/02292; H01S 5/1014; H01S 5/02–107; H01S 3/00–20;
(Continued)

(56) References Cited

U.S. PATENT DOCUMENTS

| 4,966,430 A | * | 10/1990 | Weidel | G02B 6/2817 |
|---|---|---|---|---|
| | | | | 257/84 |
| 5,003,550 A | * | 3/1991 | Welch | H01S 5/42 |
| | | | | 372/102 |

(Continued)

FOREIGN PATENT DOCUMENTS

| EP | 2913902 A1 | * | 9/2015 | | G02B 6/30 |
|---|---|---|---|---|---|
| WO | WO-2016011002 A1 | * | 1/2016 | | G02B 6/12002 |

OTHER PUBLICATIONS

Groumas et al., "Complex Monolithic and InP Hybrid Integration on High Bandwidth Electro-Optic Polymer Platform", Aug. 15, 2012, Optics Letters, vol. 73, No. 16, 3465-3467. (Year: 2012).*

(Continued)

*Primary Examiner* — Joshua King
(74) *Attorney, Agent, or Firm* — Parsons & Goltry; Robert A. Parsons; Michael W. Goltry

(57) ABSTRACT

A monolithic photonic integrated circuit includes a platform, a monolithic laser formed in/on the platform, and an electro-optic polymer modulator monolithically built onto the platform and optically coupled to the monolithic laser. The polymer modulator is optically coupled to the monolithic laser by waveguides including electro-optic polymer waveguides. The electro-optic polymer modulator and the electro-optic polymer waveguides including an electro-optic polymer core and top and bottom electro-optic polymer cladding layers. The electro-optic polymer core having an electro-optic coefficient ($r_{33}$) greater than 250 pm/v, and a Tg 150° C. to 200° C., and the top and bottom electro-optic polymer cladding layers having a Tg approximately the same as the Tg of the electro-optic polymer core.

30 Claims, 17 Drawing Sheets

(51) Int. Cl.
    *G02B 6/293*     (2006.01)
    *H01S 5/026*     (2006.01)
    *H01S 5/10*     (2006.01)

(52) U.S. Cl.
    CPC ...... *G02B 6/12011* (2013.01); *G02B 6/12016* (2013.01); *G02B 6/12028* (2013.01); *G02B 6/29352* (2013.01); *H01S 5/0265* (2013.01); *H01S 5/0268* (2013.01); *G02B 2006/12061* (2013.01); *G02B 2006/12097* (2013.01); *H01S 5/1014* (2013.01)

(58) Field of Classification Search
    CPC ........ H01S 5/0607–0614; H01S 5/0262–0268; G02B 6/12002; G02B 2006/12071; G02B 2006/12069–12076; G02B 2006/12142
    See application file for complete search history.

(56) References Cited

U.S. PATENT DOCUMENTS

| | | | | |
|---|---|---|---|---|
| 5,051,790 | A * | 9/1991 | Hammer | G02B 6/43 257/443 |
| 5,125,054 | A * | 6/1992 | Ackley | G02B 6/30 385/130 |
| 5,218,584 | A * | 6/1993 | Gfeller | G11B 7/0908 369/112.27 |
| 5,321,718 | A * | 6/1994 | Waarts | G02F 1/37 359/326 |
| 5,825,047 | A * | 10/1998 | Ajisawa | G02F 1/025 257/12 |
| 5,937,129 | A * | 8/1999 | Jeong | G02B 6/12007 385/122 |
| 6,031,945 | A * | 2/2000 | You | G02B 6/1221 385/14 |
| 6,210,867 | B1 * | 4/2001 | You | G02F 1/065 216/24 |
| 6,236,773 | B1 * | 5/2001 | Butler | G02B 6/12004 385/14 |
| 6,282,219 | B1 * | 8/2001 | Butler | G02B 6/12004 372/102 |
| 6,542,525 | B1 * | 4/2003 | Matsumoto | H01S 5/0265 372/26 |
| 6,558,585 | B1 * | 5/2003 | Zhang | G02F 1/065 205/122 |
| 6,778,572 | B1 * | 8/2004 | Ohsaka | H01L 24/05 257/753 |
| 6,934,313 | B1 * | 8/2005 | Deacon | H01S 5/0607 372/39 |
| 7,327,771 | B2 * | 2/2008 | Kim | G02B 6/12004 372/50.1 |
| 7,536,066 | B2 * | 5/2009 | Kato | G02B 6/12004 385/14 |
| 7,656,922 | B2 * | 2/2010 | Behfar | B82Y 20/00 257/79 |
| 9,341,786 | B1 * | 5/2016 | Gamache | G02B 6/30 |
| 2001/0041025 | A1 * | 11/2001 | Farahi | G02B 6/12002 385/14 |
| 2003/0020997 | A1 * | 1/2003 | Ash | G02F 1/015 359/238 |
| 2003/0095737 | A1 * | 5/2003 | Welch | B82Y 20/00 385/14 |
| 2004/0105480 | A1 * | 6/2004 | Sidorin | H01S 5/141 372/97 |
| 2004/0170351 | A1 * | 9/2004 | Fishman | G02F 1/3136 385/3 |
| 2005/0224946 | A1 * | 10/2005 | Dutta | G02B 6/12002 257/686 |
| 2006/0210232 | A1 * | 9/2006 | Wu | G02B 6/2813 385/140 |
| 2006/0239605 | A1 * | 10/2006 | Palen | G02B 6/4206 385/14 |
| 2009/0232443 | A1 * | 9/2009 | Oda | G02B 6/4214 385/14 |
| 2011/0052114 | A1 * | 3/2011 | Bernasconi | H01S 5/026 385/3 |
| 2011/0142395 | A1 * | 6/2011 | Fortusini | G02B 6/34 385/37 |
| 2011/0222570 | A1 * | 9/2011 | Junesand | H01S 5/021 372/50.1 |
| 2012/0072931 | A1 * | 3/2012 | Imada | G11B 5/314 720/672 |
| 2013/0016744 | A1 * | 1/2013 | Li | H01S 5/1039 372/20 |
| 2014/0153605 | A1 * | 6/2014 | Arimoto | H01S 5/12 372/50.11 |
| 2014/0161148 | A1 * | 6/2014 | Osinki | H01S 5/4006 372/50.1 |
| 2014/0270618 | A1 * | 9/2014 | Dinu | G02F 1/225 385/3 |
| 2015/0117491 | A1 * | 4/2015 | Lee | G02B 6/29322 374/141 |
| 2015/0236473 | A1 * | 8/2015 | Lee | G02B 6/14 359/245 |
| 2016/0248225 | A1 * | 8/2016 | Sayyah | H01S 5/0228 |
| 2016/0294155 | A1 * | 10/2016 | Zheng | H01S 5/0228 |
| 2016/0380405 | A1 * | 12/2016 | Takiguchi | H01S 5/026 372/26 |
| 2017/0179680 | A1 * | 6/2017 | Mahgerefteh | G02B 6/12004 |
| 2017/0256915 | A1 * | 9/2017 | Ghosh | H01S 5/0421 |

OTHER PUBLICATIONS

Millan-Mejia et al., "Fabrication Technology of a Slot Waveguide Modulator in InP Membranes on Silicon (IMOS)", May 8-20, 2016, ECIO, 1-2. (Year: 2016).*
Zhang et al., "Passive and Electro-Optic Polymer Photonics and InP Electronics Integration", May 1, 2015, Proc. SPIE 9516, Integrated Optics: Physics and Simulations II, 951603. (Year: 2015).*
Zhang et al., "Hybrid Photonics Integration on a Polymer Platform", Sep. 21, 2015, Photonics, 1005-1026. (Year: 2015).*
Zhang et al., "Polymer-Based Hybrid Integrated Photonic Devices for Silicon On-Chip Modulation and Board-Level Optical Interconnects", Jul. 24, 2013, IEEE Journal of Selected Topics in Quantum Electronics, vol. 19, No. 6, 1-15. (Year: 2013).*
Hochberg et al., "Terahertz All-Optical Modulation in a Silicon-Polymer Hybrid System", Aug. 20, 2006, Nature Materials, vol. 5, 703-709. (Year: 2006).*

* cited by examiner

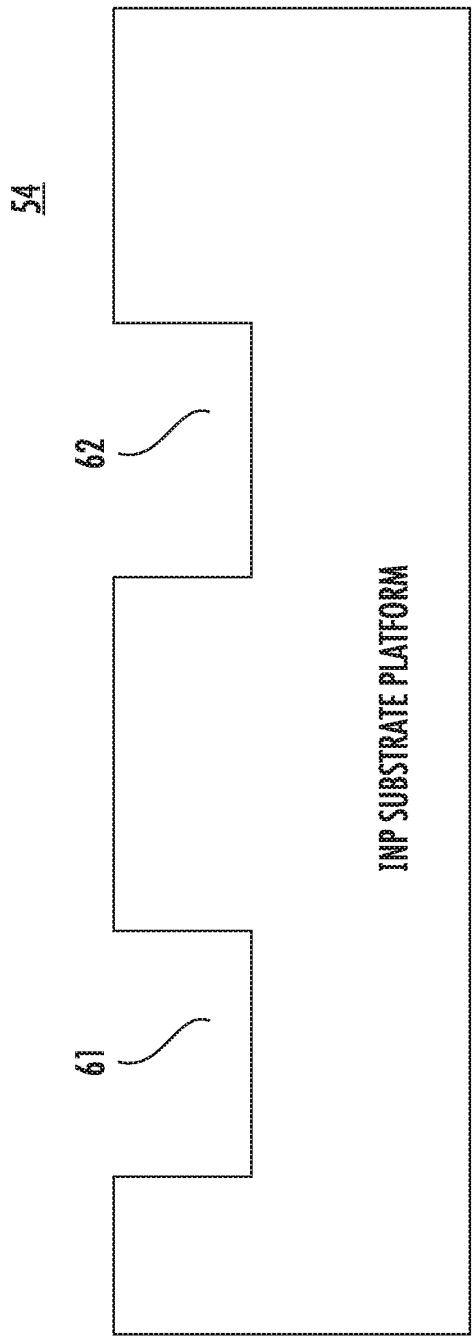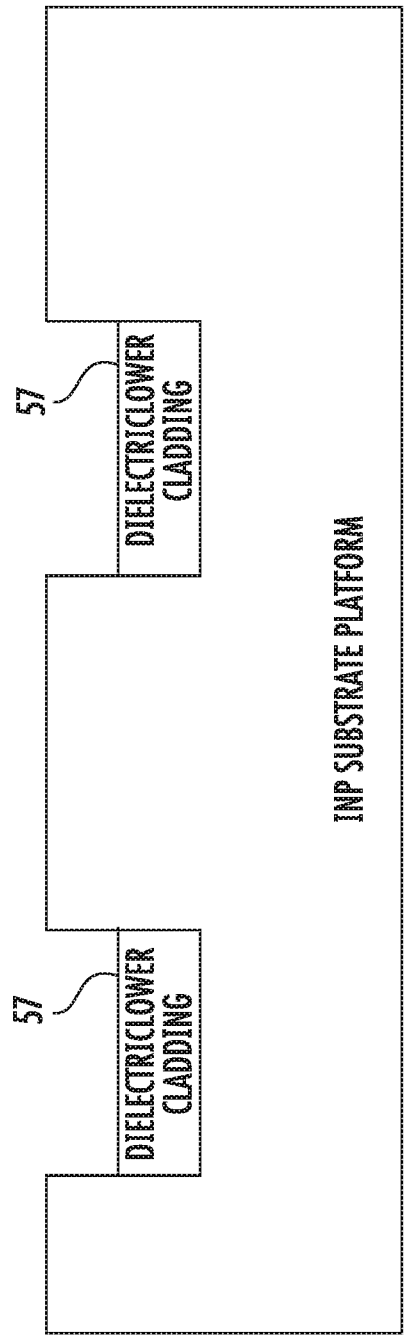
FIG. 6A
FIG. 6B

- STRAIGHTFORWARD POLING
  - NO VOLTAGE DIVISION
  - $V_{CORE} = V_{POLE}$

- PROBLEMATIC POLING
  - VOLTAGE DIVISION
  - $V_{CORE} \ll V_{POLE}$ $\sigma$ = CONDUCTIVITY RESISTANCE = $\dfrac{\text{LENGTH}}{\sigma \times \text{AREA}}$ FOR $V_{CORE} = V_{POLE}$
$\sigma_{CLAD} \gg \sigma_{CORE}$ WHEN $V_{CORE} = V_{POLE}$, R33 IS MAXIMIZED AND RESULTING DRIVE VOLTAGE IS MINIMIZED

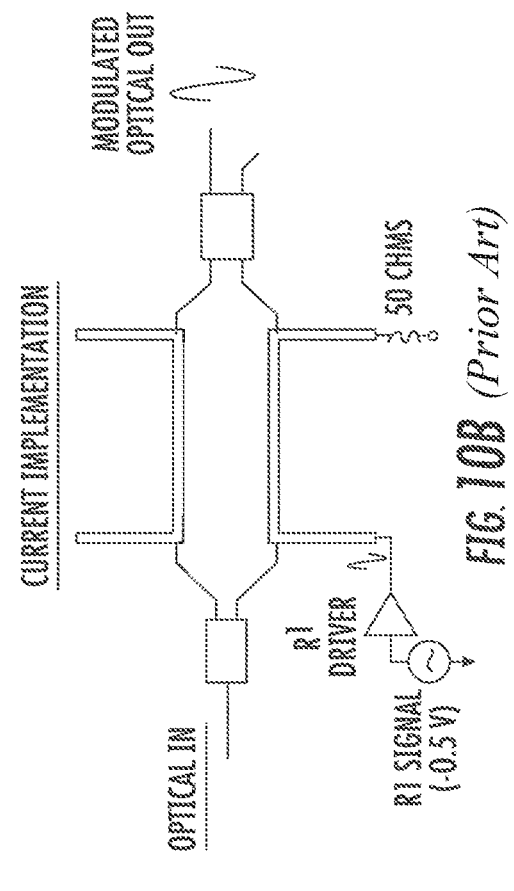
FIG. 10A *(Prior Art)*
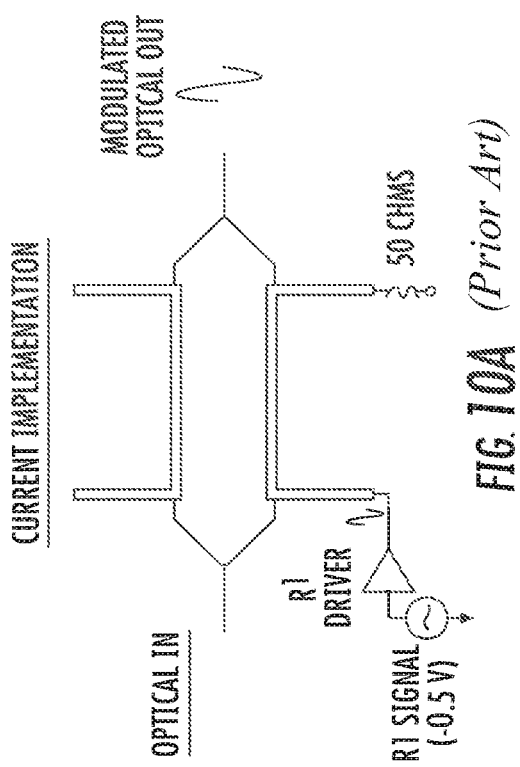
FIG. 10B *(Prior Art)*
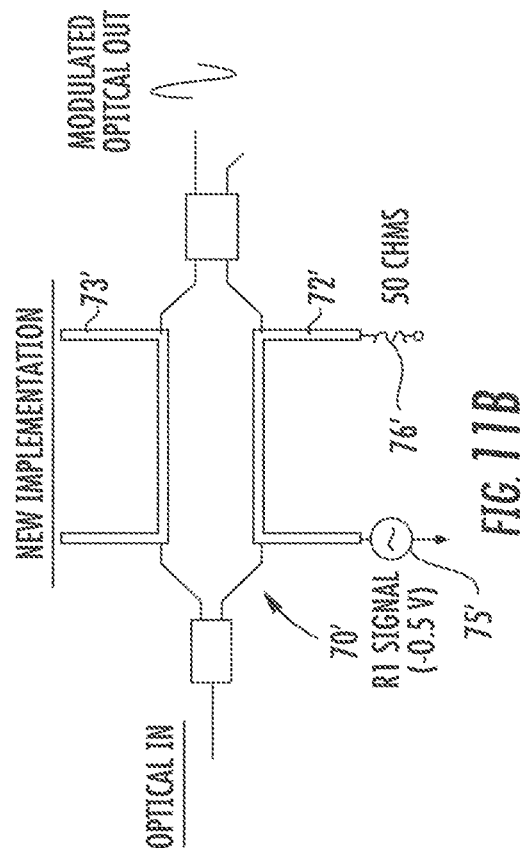
FIG. 11A
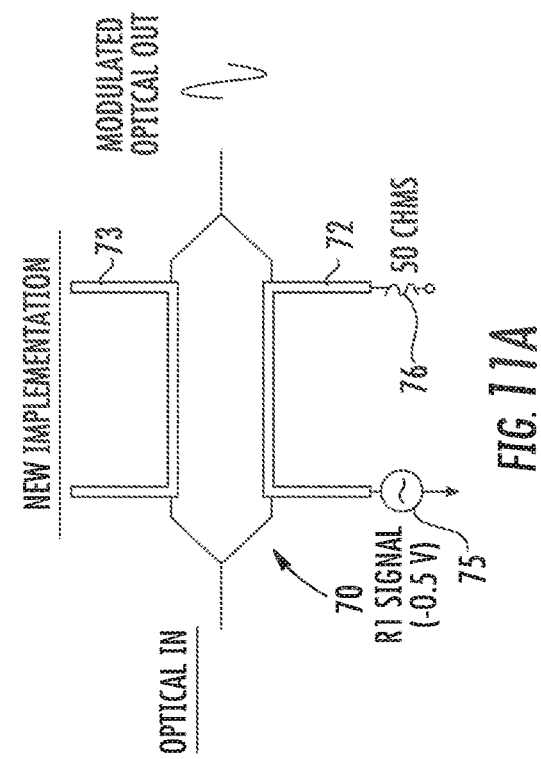
FIG. 11B

| MATERIAL | RESISTIVITY AT TG |
|---|---|
| LWL CORE MATERIAL | $2.62 \times 10^8$ Ω-CM |
| CLADDING PI2555 | $7.5 \times 10^{12}$ Ω-CM |
| CLADDING AL3355 | $7.5 \times 10^{12}$ Ω-CM |
| CLADDING UDEL | $1.2 \times 10^{11}$ Ω-CM |
| CLADDING UV15 | $\sim 10^9$ Ω-CM |

FIG. 20

| MATERIAL/APPROACH | WAVELENGTH λ(M) | THICKNESS D(M) | REFRACTIVE INDEX N | EO COEFFICIENT TO(PM/V) | LENGTH L(M) | OVERLAP R | $\gamma_N$ | VOLTAGE LENGTH PRODUCT V$\pi$R·L (V-MM) | N²R FACTOR N²TO(PM/V) | ISSUES | COMMENTS |
|---|---|---|---|---|---|---|---|---|---|---|---|
| STRAWMAN SI SLOT | 1.30E-06 | 1.20E-07 | 1.7 | 80 | 2.00E-03 | 0.2 | 0.50 | 0.99 | 393 | HIGH LOSS | |
| #1 3-LAYER | 1.30E-06 | 6.06E-06 | 1.706 | 250 | 6.90E-03 | 1 | 0.50 | 3.46 | 1239 | | V$\pi$=(λ·D)/(2·$\gamma$·L·N²·TO·I·T) (PUSH-PULL) |
| #2 3-LAYER | 1.30E-06 | 6.06E-06 | 1.706 | 200 | 8.60E-03 | 1 | 0.50 | 4.33 | 991 | | ALL 3-LAYER MODULATORS REQUIRE CAD=>CAM |
| LWL 3-LAYER | 1.30E-06 | 6.06E-06 | 1.72 | 340 | 5.00E-03 | 1 | 0.50 | 2.48 | 1730 | | |
| LN X-CUT | 1.30E-06 | 1.00E-06 | 2.2 | 308 | 8.00E-02 | 0.5 | 0.50 | 39.64 | 328 | LENGTH | |

FIG. 23

POLYMER MODULATOR AND LASER INTEGRATED ON A COMMON PLATFORM AND METHOD

FIELD OF THE INVENTION

This invention relates to lasers and polymer modulators integrated on a common platform.

BACKGROUND OF THE INVENTION

Laser modulators have been in use for 20 years. Initially discrete lasers were positioned next to discrete modulators so that higher performance signaling (and speeds above 10 Gbps) could be attained. While this technique has been commercialized it is not optimized. That is it does not reach the low cost targets, or space/size requirements, and takes lots of time to align the components, place them, package them, and test them.

It would be highly advantageous, therefore, to remedy the foregoing and other deficiencies inherent in the prior art.

Accordingly, it is an object of the present invention to provide a new and improved laser and polymer modulator integrated on a common platform.

It is another object of the present invention to provide a new and improved laser and polymer modulator integrated on a common platform with novel new design and process.

It is another object of the present invention to provide a new and improved laser and polymer modulator integrated on a common platform with more efficient coupling between source laser and optical modulator, efficient 3-layer polymer modulators, higher performance (multi GHz), and very low voltage to allow direct drive without the use of a driver circuit.

SUMMARY OF THE INVENTION

Briefly to achieve the desired objects and advantages of the instant invention in accordance with a preferred embodiment a monolithic photonic integrated circuit is provided including a platform, a monolithic laser formed in/on the platform, and a polymer modulator monolithically built onto the platform and optically coupled to the monolithic laser.

To further achieve the desired objects and advantages of the present invention a specific embodiment of a monolithic photonic integrated circuit includes a platform, a monolithic laser formed in/on the platform, and an electro-optic polymer modulator monolithically built onto the platform and optically coupled to the monolithic laser. The polymer modulator is optically coupled to the monolithic laser by waveguides including electro-optic polymer waveguides. The electro-optic polymer modulator and the electro-optic polymer waveguides including an electro-optic polymer core and top and bottom electro-optic polymer cladding layers. The electro-optic polymer core having an electro-optic coefficient ($r_{33}$) ideally greater than 250 pm/V (although electro-optic coefficients of >10 pm/V will still allow the invention to operate), and a Tg 150° C. to 200° C. (although polymer materials with a Tg in the range of 50° C. to 150° C. will still allow the invention to operate), and the top and bottom electro-optic polymer cladding layers having a Tg approximately the same as the Tg of the electro-optic polymer core.

To further achieve the desired objects and advantages of the present invention a specific embodiment of a method of fabricating a monolithic photonic integrated circuit includes the steps of providing a platform and integrating a monolithic laser in/on the platform. The monolithic laser includes one of a distributed feedback laser, a Fabry-Perot laser, a distributed Bragg reflector laser, tunable laser, VCSEL (Vertical Cavity Surface Emitting Laser) or any other type of semiconductor laser. The method further includes the steps of monolithically forming an electro-optic polymer modulator on the platform and optically coupling the electro-optic polymer modulator to the monolithic laser by waveguides including electro-optic polymer waveguides, forming the electro-optic polymer modulator and the electro-optic polymer waveguides with an electro-optic polymer core and top and bottom electro-optic polymer cladding layers, forming the electro-optic polymer core from materials having an electro-optic coefficient ($r_{33}$) ideally greater than 250 pm/v (although electro-optic coefficients of >10 pm/V will still allow the invention to operate), and a Tg 150° C. to 200° C. (although polymer materials with a Tg in the range of 50° C. to 150° C. will still allow the invention to operate), and forming the top and bottom electro-optic polymer cladding layers from materials having a Tg approximately the same as the Tg of the electro-optic polymer core.

BRIEF DESCRIPTION OF THE DRAWINGS

Specific objects and advantages of the invention will become readily apparent to those skilled in the art from the following detailed description of a preferred embodiment thereof, taken in conjunction with the drawings in which:

FIGS. 6A, 6b, 6C, and 6D are sequential cross-sectional views of the integrated laser/polymer modulator illustrated in FIG. 5A as seen from the line XX, showing steps in a method of forming the polymer Mach-Zehnder modulator;

FIGS. 10A and 10B illustrate prior art polymer modulators using rf drivers in Mach-Zehnder modulators with Y-splitters/combiners and with MMI splitters/combiners, respectively;

FIGS. 11A and 11B illustrate polymer modulators using direct driver signals (no rf drivers) in Mach-Zehnder modulators with Y-splitters/combiners and with MMI splitters/combiners, respectively;

FIG. 20 is a chart showing resistivity of core and cladding materials;

FIG. 23 illustrates a chart showing maximizing of the EO coefficient, and provides the specifications to achieve Vn=0.5V.

DETAILED DESCRIPTION OF THE DRAWINGS

A primary object of the present invention is to provide a new and improved laser and polymer modulator integrated on a common platform with novel new designs and processes. In the preferred embodiment, the common platform is single crystal InP, because lasers are naturally fabricated from InP and are already monolithic (part of the same material). It will be understood however, that the common platform could be silicon, GaAs, metal, plastic, or any other suitable organic or inorganic material. Also, while the laser described herein is generally InP, it will be understood that the lasers described herein could be could be GaAs, GaN, etc. As will be understood from the following description, the modulators are polymer based. Further, the optical connection between the laser and modulator could be free space, polymer waveguides, or semiconductor material waveguides matching the laser (i.e. InP waveguide with InP laser). The optical connecting waveguides could be dielectric based, such as silicon dioxide, silicon nitride, etc.)

One specific method or concept for the formation of a monolithic photonic integrated circuit (PIC) in accordance with the present invention, is to provide a platform/substrate, which in this specific example is InP. A laser diode (e.g. multi-layer epi and grating to form a DFB laser) is formed as part of the platform. A trench is etched in the platform/substrate and EO polymer waveguides are formed in the trench using a 3-layer structure, e.g. lower cladding layer, core, and upper cladding layer. The cladding layers are sufficiently thick so that negligible light leaks to the substrate. The waveguides are aligned with the laser emission or output channel, either directly, or via an air gap, or via a waveguide, or via a waveguide and vertical tapering of the light down to the polymer trench. Output light from the waveguide can be coupled to an output optical fiber. Alternatively, the modulator output guides can be coupled to a glass, oxide, silicon compound, or nitride guide and directed to a waveguide mux or multiplier (that can also be formed in the same material).

Figure 1A:
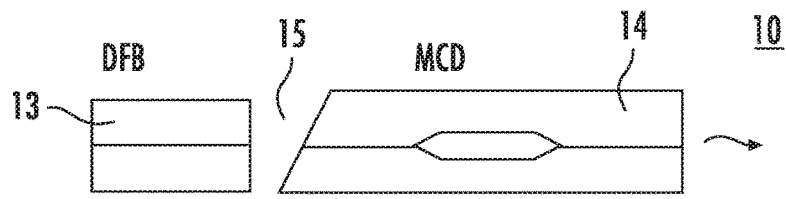
FIG. 1A is a top view of a first example of an integrated laser/polymer modulator with air gap coupling, according to the present invention.
Figure 1B:
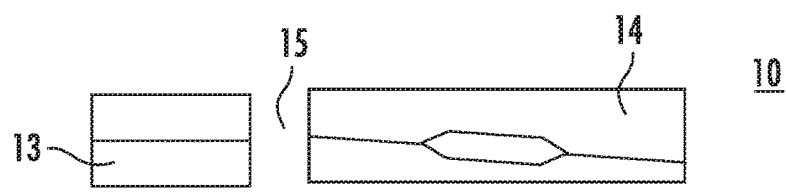
FIG. 1B is a top view of a second example of an integrated laser/polymer modulator with air gap (free space) coupling, according to the present invention.
Figure 1C:
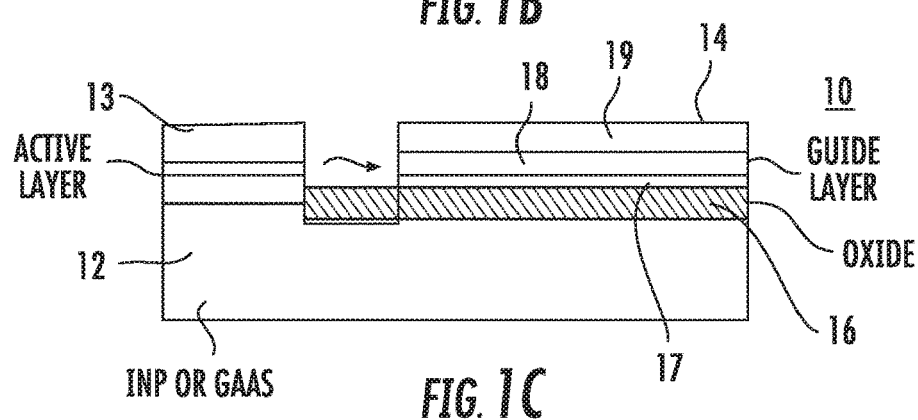
FIG. 1C is a side view of either of the integrated laser/polymer modulator with air gap (free space) coupling illustrated in FIGS. 1A and 1B.

Turning to FIG. 1, a first example of a monolithic photonic integrated circuit (PIC) 10 in accordance with the present invention, is illustrated. PIC 10 includes an InP platform 12 with a monolithic laser 13 formed in/on platform 12 as part of platform 12 and a polymer modulator 14 monolithically built onto platform 12. Monolithic laser 13 could be a distributed feedback (DFB) laser, a Fabry-Perot (FB) laser, a distributed Bragg reflector (DBR) laser, a tunable laser, a VCSEL (Vertical Cavity Surface Emitting Laser) or any other type of semiconductor laser. The polymer structure is isolated from the laser by a small etched gap 15 which results in free-space optical coupling between laser 13 and modulator 14. As illustrated in FIG. 1A gap 15 can be angled slightly, relative to the output of laser 13, to reduce reflections back into laser 13, or the edges can be substantially parallel as illustrated in FIG. 1B, with internal reflection compensation. Furthermore, the semiconductor laser could be designed with a spot size converted output which will provide a more efficient optical coupling to the waveguide.

In this specific example, polymer modulator 14 is illustrated as a Mach-Zehnder modulator with splitters/combiners/MMIs but as will be explained in more detail below modulator 14 can be any convenient modulator that can be fabricated in EO polymer based material. For the formation of modulator 14, a portion of platform 12 is removed (e.g. an etched trench is formed) and an oxide layer 16 is deposited on the surface of the removed portion to planarize the surface prior to polymer deposition, and also to restrict light from coupling to the substrate acting portion of platform 12. A 3-layer polymer structure, lower cladding layer 17, core 18, and upper cladding layer 19, is deposited on oxide layer 16 and gap 15 is formed.

Figure 2A:
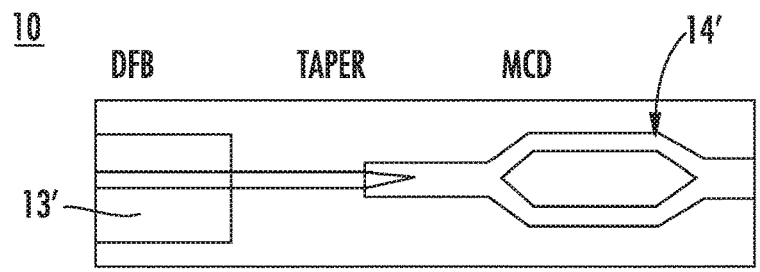
FIG. 2A is a top view of an integrated laser/polymer modulator with vertical taper coupling, according to the present invention.
Figure 2B:
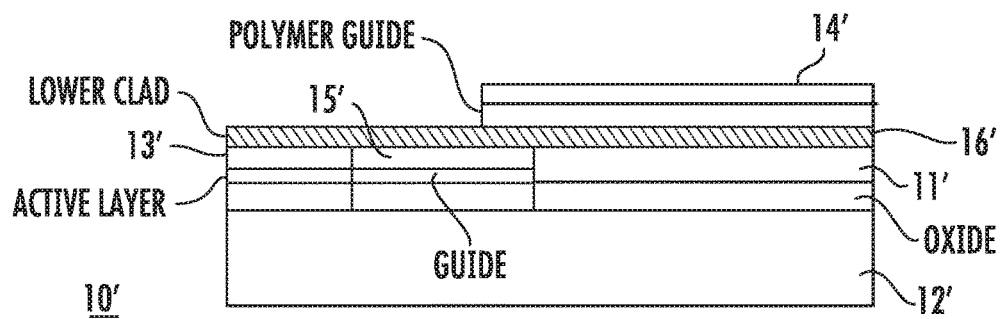
FIG. 2B is a side view of the integrated laser/polymer modulator with vertical taper coupling of FIG. 2A.

In FIGS. 2A and 2B, a second specific example of a monolithic photonic integrated circuit, PIC 10', is illustrated.

PIC 10' includes components similar to those described in FIG. 1 which are designated with similar numbers and a prime (') is added to indicate the different example. In this example a section 15' of 3-layer waveguide is formed in the portion of platform 12' that is removed. Section 15' of 3-layer waveguide is formed on an oxide layer 11' and is optically aligned with the output of laser 13'. An oxide layer 16' is used to planarize the surface prior to the deposition of modulator 14'. A portion of the input of modulator 14' is deposited directly over (overlying) a portion of section 15' of 3-layer waveguide. Thus, light from laser 13' is coupled up through the vertical taper formed by the overlying waveguide portions into modulator 14'.

In the above examples, the process for fabricating modulator 14 includes forming an etched trench and depositing an oxide layer on the surface of the trench to planarize the surface prior to polymer deposition. A polymer based material is spun on/formed into the desired waveguide/modulator structure on top of or adjacent a laser formed in the platform/substrate. The bottom cladding layer of the waveguide/modulator structure can be vacuum deposited or an otherwise grown dielectric layer which has excellent thickness control. The core and top cladding layer or layers are polymers with fine thickness control. Thus, the fabrication is simple for high speed device performance and operation.

Figure 3A:
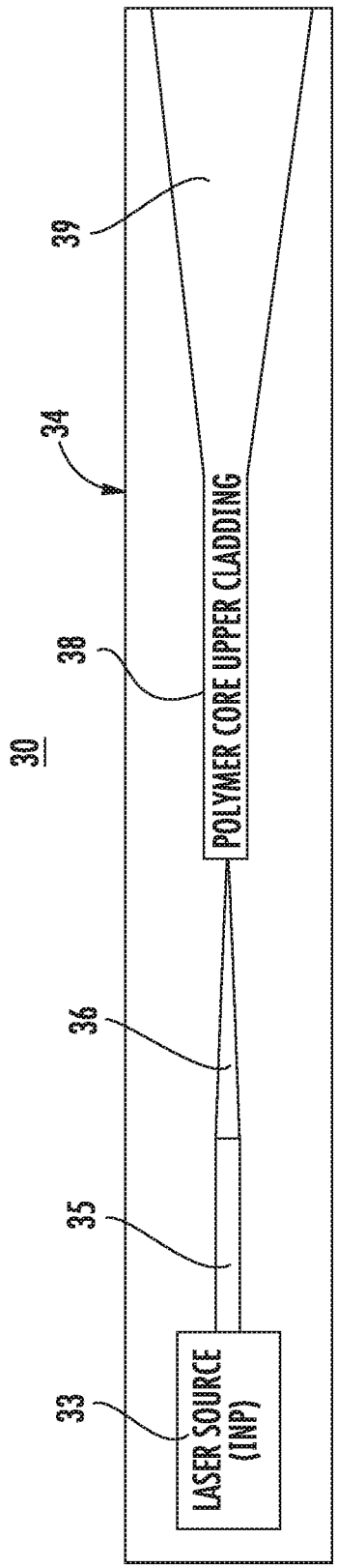
FIG. 3A is a top view of an integrated laser/polymer modulator with semiconductor waveguide taper coupling and polymer waveguide and expansion port, according to the present invention.
Figure 3B:
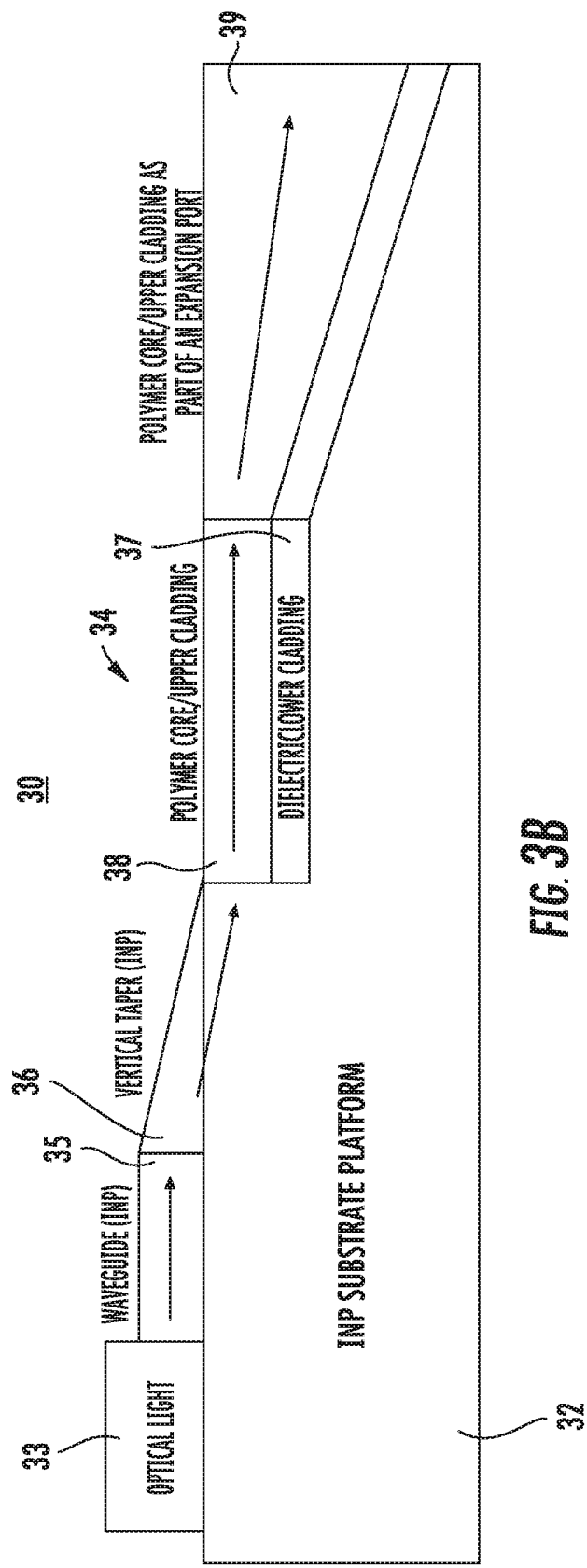
FIG. 3b is a cross-sectional view of the integrated laser/polymer modulator of FIG. 3A.

Turning now to FIGS. 3A and 3B, another example of a monolithic photonic integrated circuit, PIC 30, is illustrated. PIC 30 includes an InP platform 32 with a monolithic laser 33 formed in/on platform 32 as part of platform 32 and a polymer modulator 34 monolithically built onto platform 32. Monolithic laser 33 could be a distributed feedback (DFB) laser, a Fabry-Perot (FB) laser, a distributed Bragg reflector (DBR) laser, a tunable laser, a VCSEL (Vertical Cavity Surface Emitting Laser) or any other type of semiconductor laser. A section 35 of InP waveguide is formed on/in platform/substrate 32 in optical alignment with laser 33. A second section 36 of InP waveguide is formed in optical alignment with section 35 and is tapered, both vertically and horizontally into an output point. A trench is formed (e.g. etching, etc.) in platform/substrate 32 generally in optical alignment with laser 33 but on a lower level. The trench is formed with a first constant dimensions section and with a gradually expanding, horizontally and vertically downward, section. A dielectric lower cladding layer 37, with excellent thickness control, is deposited in the trench to planarize the surface prior to polymer deposition and to provide a lower cladding layer for the waveguides and modulator. Polymer based material 38 is deposited in the trench on dielectric layer 37 in the first section to form a core and upper cladding layer. Polymer based material 38 includes the modulator and input waveguides of PIC 30 which are optically aligned with InP waveguide section 36. That is the output point of tapered section 36 is horizontally aligned and vertically above the input of waveguide/modulator 38 so that light from laser 33 is coupled down through the vertical taper formed by the overlying waveguide portions into waveguide/modulator 38. The tapered section 39 of the trench is filled with Polymer based material which forms an expansion port to facilitate coupling light efficiently to optical fibers and the like.

Figure 4A:
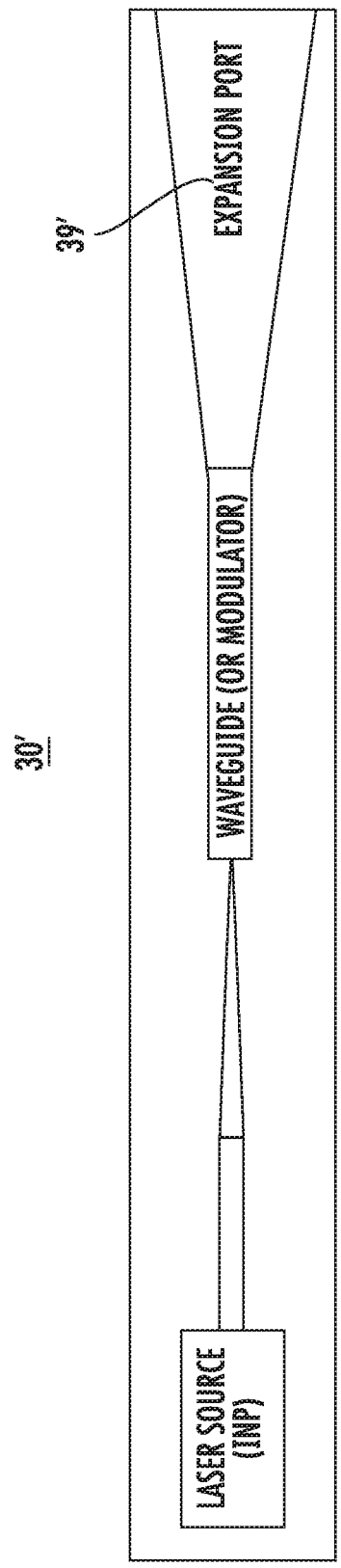
FIG. 4A is a top view of an integrated laser/polymer modulator with semiconductor waveguide taper coupling and polymer waveguide stepped expansion port, according to the present invention.
Figure 4B:
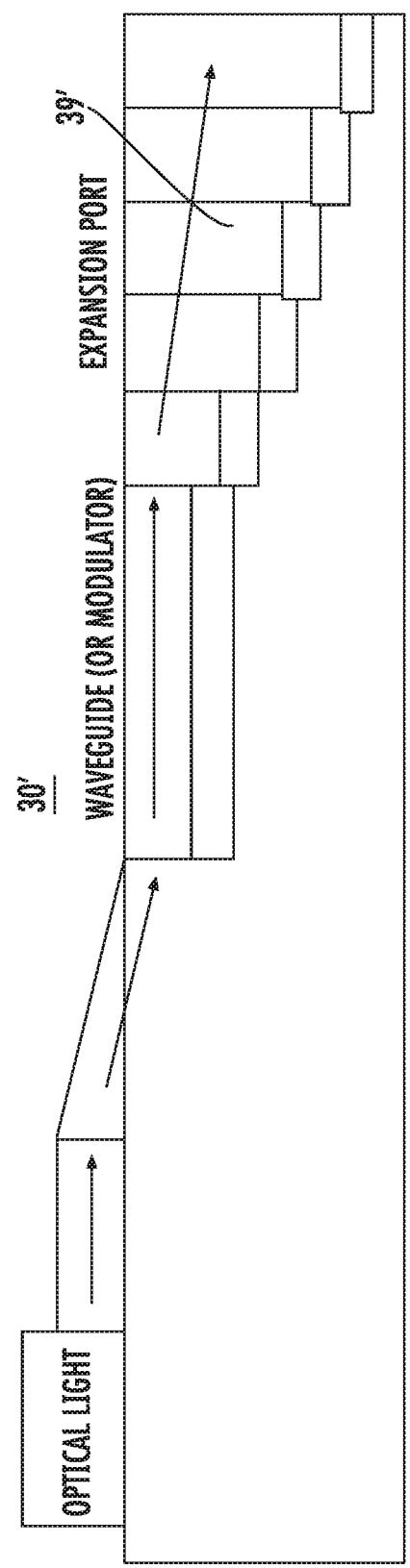
FIG. 4B is a cross-sectional view of the integrated laser/polymer modulator with semiconductor waveguide taper coupling and polymer waveguide stepped expansion port of FIG. 4A.

Referring additionally to FIGS. 4A and 4B, a monolithic photonic integrated circuit, PIC 30', is illustrated. PIC 30' includes components similar to those described in FIGS. 3A and 3B, which are designated with similar numbers and a prime (') is added to indicate the different example. In this example the only difference is that tapered section 39' is stepped downwardly to provide the vertical taper. In both examples, the core of the waveguide will reduce in volume and dimensions as the optical beam is expanded because the core of the waveguide will be less confined.

Figure 5A:
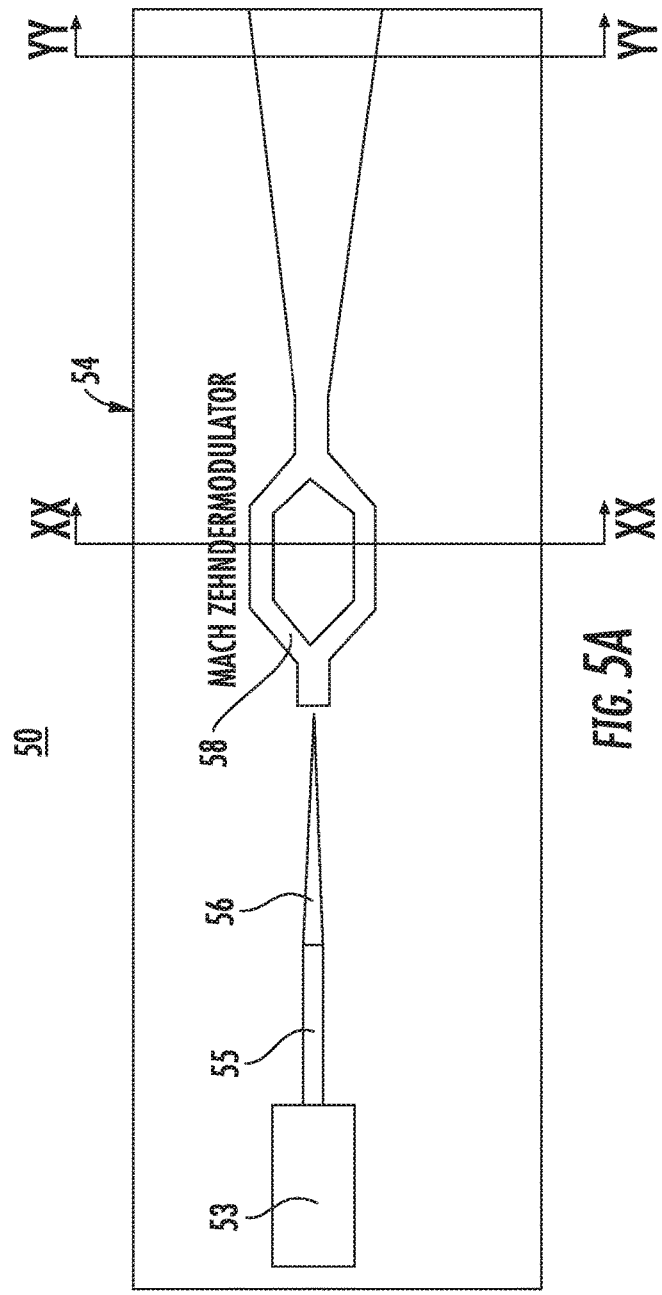
FIG. 5A is a top view of an integrated laser/polymer modulator with Mach-Zehnder modulator and polymer expansion waveguide, according to the present invention.
Figure 5B:
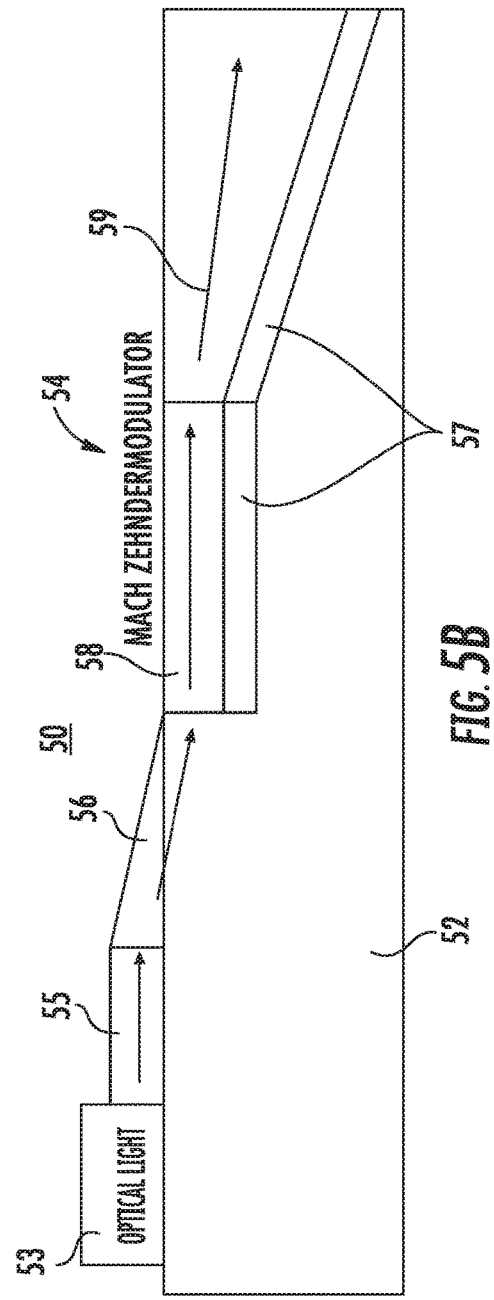
FIG. 5B is a cross-sectional view of the integrated laser/polymer modulator illustrated in FIG. 5A.

Referring now to FIGS. 5A and 5B, an example of a monolithic photonic integrated circuit, PIC 50, is illustrated. PIC 50 includes an InP platform 52 with a monolithic laser 53 formed in/on platform 52 as part of platform 52 and a polymer modulator 54 monolithically built onto platform 52. Monolithic laser 53 could be a distributed feedback (DFB) laser, a Fabry-Perot (FB) laser, a distributed Bragg reflector (DBR) laser, a tunable laser, a VCSEL (Vertical Cavity Surface Emitting Laser) or any other type of semiconductor laser. A section 55 of InP waveguide is formed on/in platform/substrate 52 in optical alignment with laser 53. A second section 56 of InP waveguide is formed in optical alignment with section 55 and is tapered, both vertically and horizontally into an output point. A trench is formed (e.g. etching, etc.) in platform/substrate 52 generally in optical alignment with laser 53 but on a lower level. All of the components of PIC 50 are similar to components of FIGS. 3A and 3B, except for modulator 54 which is a Mach-Zehnder type of modulator. The forming and filling of a trench for the fabrication of the Mach-Zehnder type of modulator 54 is described in detail in conjunction with FIGS. 6A, 6B, 6C, and 6D.

Figure 6C:
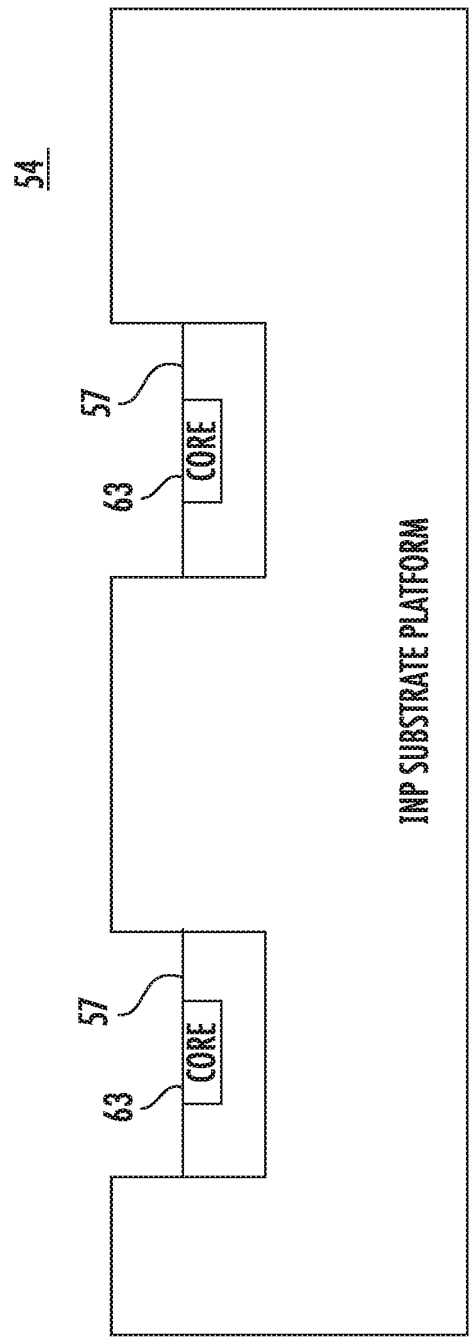

Referring additionally to FIGS. 6A, 6B, 6C, and 6D, dross-sectional views as seen from the line XX in FIG. 5A illustrate sequential steps in a process for fabricating the Mach-Zehnder type of modulator 54. As is understood in the art, in a Mach-Zehnder modulator an input waveguide is split up into two waveguide interferometer arms, represented along line XX by two spaced apart trenches 61 and 62 in FIG. 6A. Dielectric layer 57 is vacuum deposited or otherwise grown in trenches 61 and 62, as illustrated in FIG. 6B, which can be achieved with excellent thickness control. Typical dielectric materials with excellent thickness control include oxides, nitrides, oxynitrides, etc. where the deposition system is typically CVD (chemical vapor deposition). Here it will be understood that lower cladding layer 57 could alternatively be formed of polymer based material. The optical refractive index of the lower cladding material will be lower than that of the core material. The lower cladding material can be composed of either polymer or a dielectric material. Advantages of the lower cladding material are excellent thickness control so that the alignment of the core layer is accurately placed to receive optical signals from the laser source. Usual polymer lower cladding materials may include commercially available polymers such as: UV/thermal cure types UV15, UV25 from Masterbond, OC-3021 from Dymax, CO-160 from ChemOptics, Level M10-44 from Brewer Science, AL-3355 from FOC, NOA61 from Norland; as well as Epoxies from DOW, Epoxylite; as well as Thermoplastics such as UDEL from Solvay, PI2555 from HD Microsystems, Matrimid 5218 from Huntsman, Polysulfone from Aldrich and Ultem from SABIC.

Figure 6D:
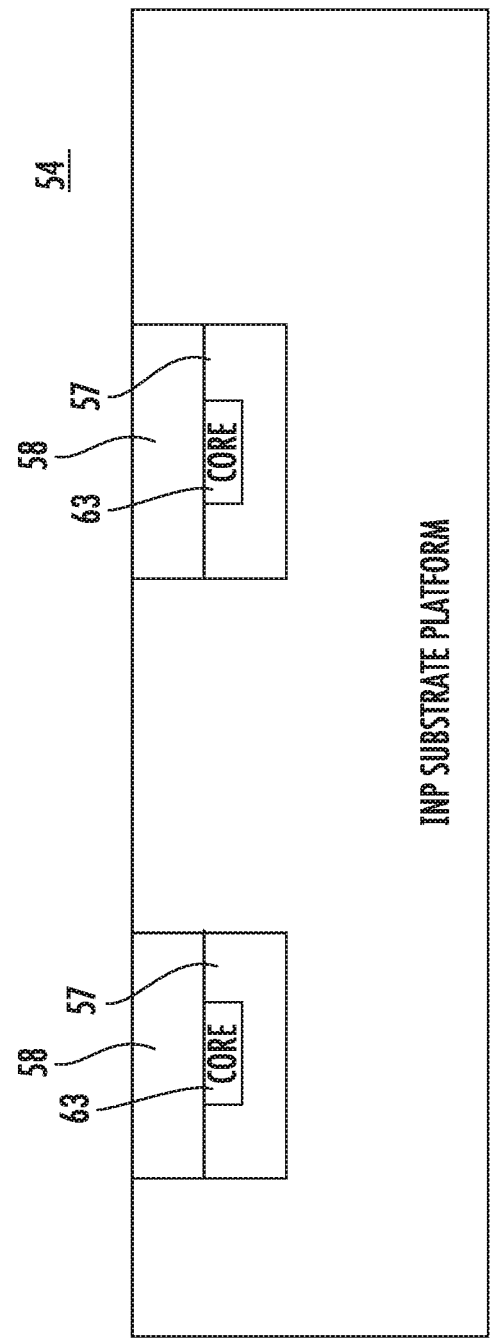
Figure 6E:
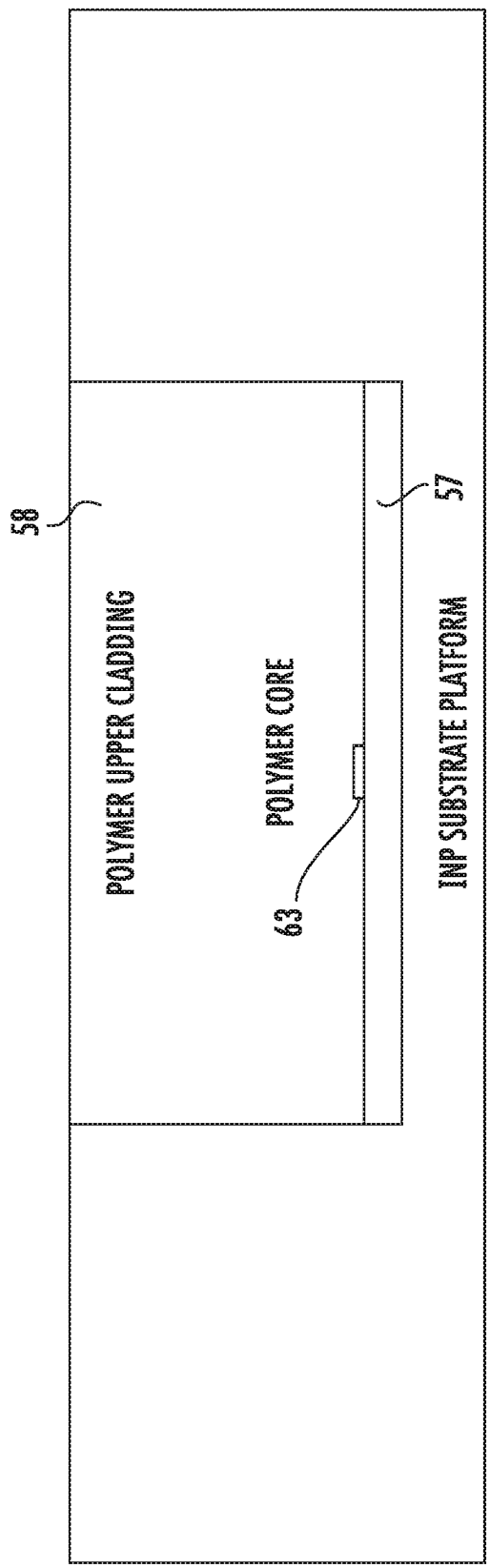
FIG. 6E is a cross-sectional view of the integrated laser/polymer modulator illustrated in FIG. 5A as seen from the line YY, showing the polymer expansion waveguide.

Lower cladding layer 57 is etched and a polymer core 63 is deposited in the etched portion, as illustrated in FIG. 6C. Trenches 61 and 62 (along with connecting portions) are back filled with an upper polymer cladding layer 58. As illustrated in FIG. 6D. It will be understood that this procedure is used to form the entire modulator section 54, as well as the entire expansion port 59. As explained above, expansion port 59 is tapered horizontally outward and vertically downward (see FIGS. 5A and 5B), and the trench is expanded similarly, as can be seen in FIG. 6E, which is a cross-section as seen from the line YY in FIG. 5A. Since the trench is expanded, lower cladding layer 57 and upper cladding layer 58 are also expanded, however, core 63 remains constant so that it is relatively smaller which improves coupling with optical fibers and smaller polymer cores.

To provide a PIC including a semiconductor platform with a laser monolithically formed in/on the platform as part thereof and an optically coupled polymer modulator monolithically built onto the platform, some initial technology and attribute must be determined. For example, one attributes to be achieved is to have a direct drive EO polymer modulator, that is, no rf drive amplification is required for the modulator. To achieve this attribute and to provide an optimized PIC, some required technical items are: a core EO polymer for the modulator with an EO coefficient, $r_{33}$, ideally greater than 250 pm/v (although electro-optic coefficients of >10 pm/V will still allow the invention to operate); also, the cladding layers of the modulator need to have higher levels of conductivity (generally equal to or higher than the core), which will allow optimal poling of the polymer material; and the waveguide propagation losses need to be less than 4 dB/cm and more specifically 2.2 dB/cm for device insertion loss less than 8 dB and more specifically 6 dB. With these characteristics in mind, some explanations of the characteristics and several examples of 3, 4, and 5 layer waveguide/modulators are described.

Figure 7A:
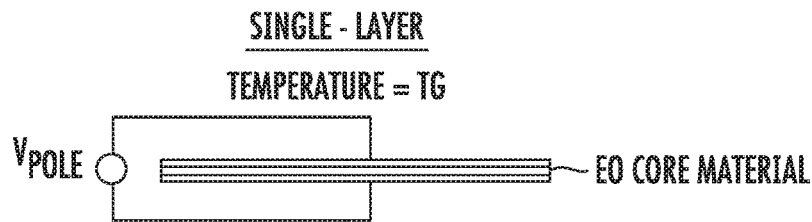
FIGS. 7A and 7B illustrate a concept of optimized polymer modulator poling with a single resistance layer in physical and schematic views, respectively.
Figure 7B:
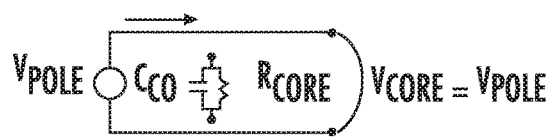
Figure 8A:
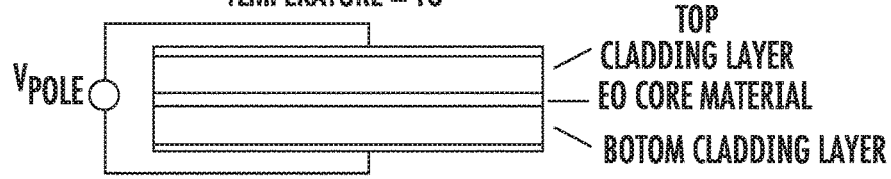
FIGS. 8A and 8B illustrate a concept of optimized polymer modulator poling in a three-layer stack with matched resistance layers in physical and schematic views, respectively.
Figure 8B:
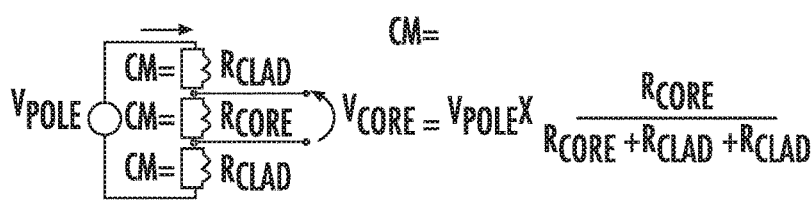

As is understood in the art, before poling of a polymer the chromophores with a permanent dipole are randomly oriented. Poling consist of heating the polymer to a temperature near the glass transition temperature (Tg) of the material and applying an electric field to align the chromophores (or a substantial quantity of them). As is also understood, properly poling a polymer is a major determinate of some characteristics, such as EO coefficient of the material. Referring to FIGS. 7A and 7B, it can be seen that poling a single layer of polymer material (e.g. a core) is relatively straightforward, since the poling voltage is equal to the voltage applied across the core or single layer. Referring additionally to FIGS. 8A and 8B, it can be seen that once upper and lower matched cladding layers are formed with the core (e.g. a 3-layer modulator stack) the poling becomes more complex because of the voltage division between the core and the cladding layers. As described, when $V_{core}$ is approximately equal to $V_{pole}$ the EO coefficient ($r_{33}$) is maximized and the resulting drive voltage for the waveguide is minimized. Further, it can be determined from FIG. 8B and the included equation that $V_{core}$ is approximately equal to $V_{pole}$ when the conductivity of the cladding layers ($\sigma_{clad}$) is much greater than the conductivity of the core ($\sigma_{core}$).

Figure 9A:
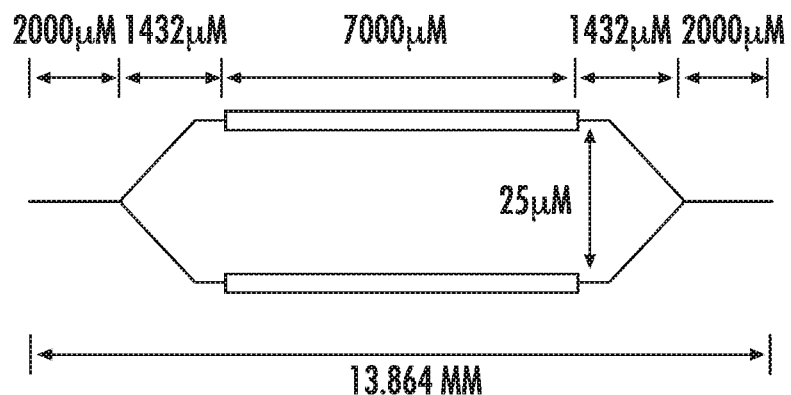
FIGS. 9A and 9B illustrate two examples of polymer Mach-Zehnder modulators with Y-splitters/combiners and with MMI splitters/combiners, respectively.
Figure 9B:
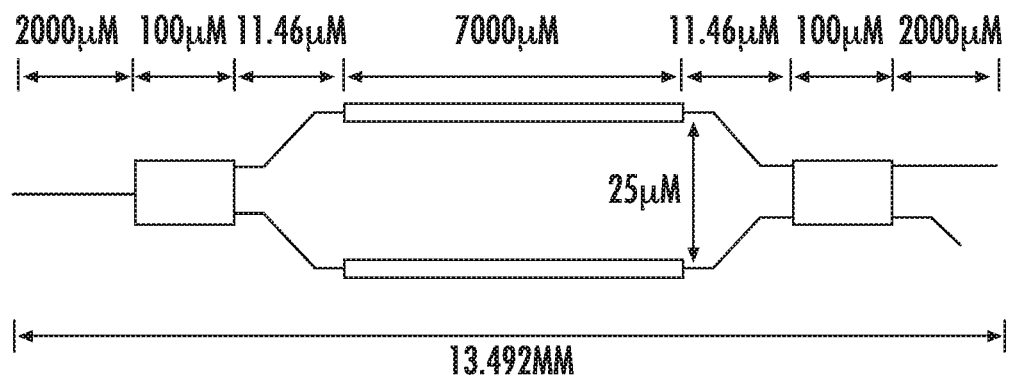

Turning to FIGS. 9A and 9B, typical Mach-Zehnder modulator layouts for the PICs described herein are illustrated. In FIG. 9A, Y-splitters/combiners are attached to a Mach-Zehnder type modulator and in FIG. 9B MMI (multimode interference) splitters/combiners are attached to the Mach-Zehnder type modulator in place of the Y-splitters/combiners. In FIG. 9A, the input waveguide is 2000 um long, the input Y-splitter is 1432 um long, the Mach-Zehnder interferometer legs are 7000 um long, the output Y-splitter is 1432 um long, and the output waveguide is 2000 um long, for a total of 13,864 mm long. In FIG. 9B, the input waveguide is 2000 um long, the input MMI splitter is 100 um long with connecting legs 1146 um long, the Mach-Zehnder interferometer legs are 7000 um long, the output mmi splitter is 100 um long with connecting legs 1146 um long, and the output waveguide is 2000 um long, for a total of 13,492 mm long. Thus, benefits of these structures are that the full length of the modulator portion of the platform is approximately 13.5 mm and as understood in the art, the length is important for packaging. For Mach-Zehnder modulator designs of this type, the higher the EO coefficient, $r_{33}$, the shorter the device length. For this type of device to be useful, the waveguide loss is preferably reduced to <2.2 dB/cm, assuming 1.5 dB coupling loss per end can be achieved and a total insertion loss of 6 dB is acceptable. With an rf design, the performance at these levels is >50 GHz.

Turning now to FIGS. 10A and 10B, prior art Mach-Zehnder type modulators with Y-splitters/combiners attached and with MMI splitters/combiners attached, respectively, are illustrated. Input or modulating signals are applied to the modulators by means of U-shaped electrodes overlying each arm of the Mach-Zehnder modulator in a well-known manner. In these prior art examples rf modulating signals (set at approximately 0.5V in this example) are applied to the electrodes by way of rf drivers connected to one end of one of the U-shaped electrodes, the other end being connected through a 50 ohm current limiter to a return, such as ground. It will of course be understood that the driver adds substantial cost, size, complexity, etc. to any packaging of the modulator.

Referring additionally to FIGS. 11A and 11B, Mach-Zehnder type modulators, fabricated in accordance with the present invention, with Y-splitters/combiners attached, designated 70, and with MMI splitters/combiners attached, designated 70', respectively, are illustrated. Input or modulating signals are applied to each of modulators 70 and 70' by means of U-shaped electrodes, 72 and 73 for modulator 70 and 72' and 73' for modulator 70', overlying each arm of the Mach-Zehnder modulator. In accordance with the present invention, an rf modulation signal 75 of approximately 0.5V is applied directly to one end of U-shaped electrode 72 and the other end is connected through a 50 ohm current limiter 76 to a return, such as ground. Similarly, an rf modulation signal 75' of approximately 0.5V is applied directly to one end of U-shaped electrode 72' and the other end is connected through a 50 ohm current limiter 76' to a return, such as ground. Thus, two examples of direct drive polymer modulators (DDPM) are illustrated in FIGS. 11A and 11B. In this preferred embodiment, each of modulators 70 and 70' use an EO polymer with an $r_{33}$>250 pm/V. Also, modulators 70 and 70' include at least 3-layer waveguides with customized cladding layers having relatively high conductivity (see explanation above) which allows the DDPM waveguides to be optimally poled. Further, the waveguides have propagation losses less than 2.2 dB/cm and insertion losses less than 6 dB.

Figure 12A:
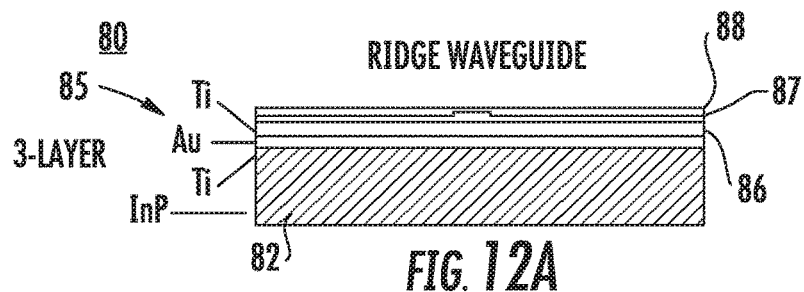
FIGS. 12A, 12B, and 12C illustrate a method of fabricating a polymer modulator using a ridge waveguide with 3-layer stack, 4-layer stack, and 5-layer stack, respectively, on an InP platform, in accordance with the present invention.

Turning now to FIG. 12A, a specific example of a 3-layer polymer modulator/waveguide 80 in accordance with the present invention is illustrated. Modulator/waveguide 80 includes an InP platform/substrate 82 with a ridge waveguide 84 monolithically formed thereon. Waveguide 84 may be fabricated using any convenient method for the specific application but the method described above using the etched trench is preferred for its simplicity and accuracy. In this specific example the first material deposited on the InP surface in the trench is a metallization 85, such as Au, Ti/Au, or Cr/Au, in this example sequential layers of Ti/Au/Ti are deposited. A bottom cladding layer 86 is deposited on metallization 85, a core 87 with upwardly directed ridge is deposited on bottom cladding layer 86, and a top cladding layer 88 is deposited on core 87. Modulator/waveguide 80 is referred to as a "ridge waveguide". The modulator generally includes coplanar electrodes for poling and modulation unless a metal layer is deposited on the InP substrate below the polymer layers, hence metallization 85.

In this and the following examples, the material for cladding layers 86 and 88 is selected to have the following characteristics. The refractive index of the cladding material at 1550 nm is equal to the refractive index of the material of core 87 minus approximately 0.05. The coefficient of thermal expansion (CTE) of the cladding material is as close to the CTE of the material of core 87 as possible. The Tg of the cladding material is near the Tg of the core material (generally 150° C. to 200° C.). The resistivity of the cladding material, at room temperature, is greater than approximately $10^8$ Ohm-cm. The resistivity of the cladding material, at poling temperature (~Tg), is much less than the resistivity of the core material (<~$10^8$ Ohm-cm). The optical loss of the cladding material is less than 1 dB/cm from 1300 nm to 1600 nm. The dielectric loss tangent of the cladding material is less than 0.002 at 10 GHz. The cladding material is not chemically attacked by the core material, core material solvents, or photoresist solvents. The cladding material forms an adhesive bond with Au, Ti/Au, or Cr/Au metallization and with the core material. In addition, the cladding material must be dry etchable with reasonable etch rates, the endfaces must be able to be cleaved or direct cut, and it must provide a hermetic or at least an $O_2$ block.

Figure 21:
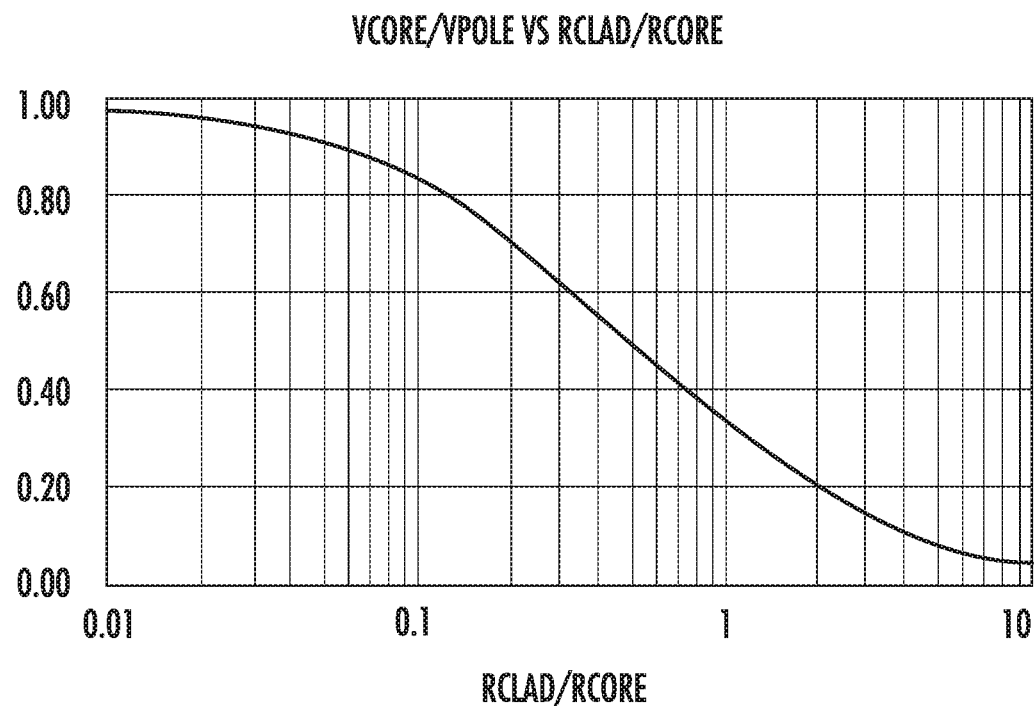
FIG. 21 is a graph illustrating the relationship Vcore/Vpole vs Rclad/Rcore.
Figure 22:
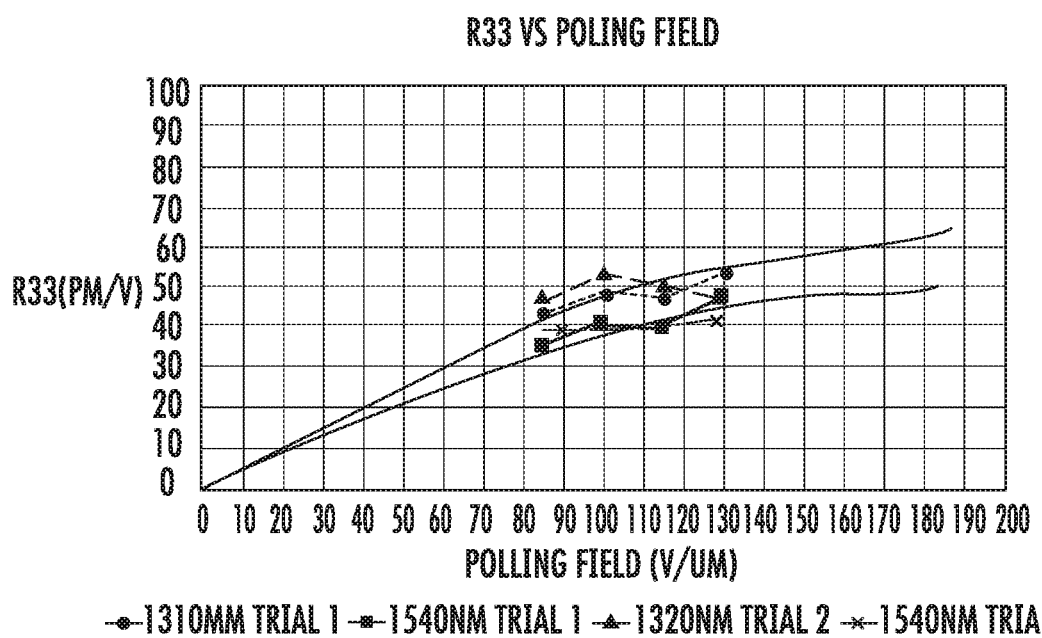
FIG. 22 is a graph illustrating the relationship of $r_{33}$ vs poling field.

A chart is illustrated in FIG. 20 that includes a list of polymer core and cladding material and their resistivity at Tg. Usual polymer lower cladding materials may include commercially available polymers such as: UV/thermal cure types; OC-3021 from Dymax, CO-160 from ChemOptics, Level M10-44 from Brewer Science, AL-3355 from FOC, NOA61 from Norland; as well as Epoxies from DOW, Epoxylite; as well as Thermoplastics such as UDEL from Solvay, PI2555 from HD Microsystems, Matrimid 5218 from Huntsman, Polysulfone from Aldrich etc. It can be seen from this chart that core materials generally have much smaller resistivity than cladding materials. Also, in FIG. 21 a graph illustrating the relationship Vcore/Vpole vs Rclad/Rcore. From this graph, it can be determined that a smaller Vcore results in a smaller $r_{33}$ and referring additionally to the graph in FIG. 22, it can be seen that a smaller $r_{33}$ results in larger required modulator drive voltage. There are commercially available EO polymers that exhibit very large $r_{33}$ values, but the lack of a cladding material with the correct properties makes it difficult to efficiently pole these EO polymers. Many commercially available EO polymers have a low Tg making them unsuitable for typical applications. From the above charts and graphs it can be seen that EO polymer material with a large $r_{33}$ and high Tg are required.

A table is provided in FIG. 23 showing several modulator approaches. In the table, 'length' refers to the active electrode length and the 'overlap' is the overlap factor for the applied snf optical fields. For a 3-layer microstrip configuration, the overlap is ~1. The "Strawman Si slot" provides the shortest length modulator but currently has excessive optical losses. The table of FIG. 23 provides the specifications to achieve $V_\pi$ approximately equal to 0.5V. With a high EO coefficient polymer for the core ($r_{33}$>250 pm/V), and cladding with conductivity much larger than that of the core material at its poling temperature (~Tg), the active electrode length is approximately 7 mm for a $V_\pi$ approximately 0.5V using the #1 3-layer material approach.

Figure 12B:
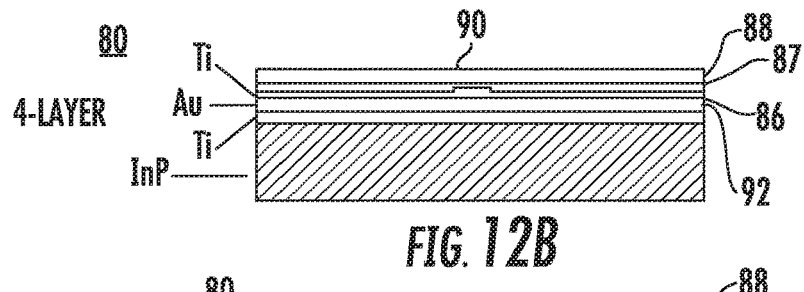
Figure 12C:
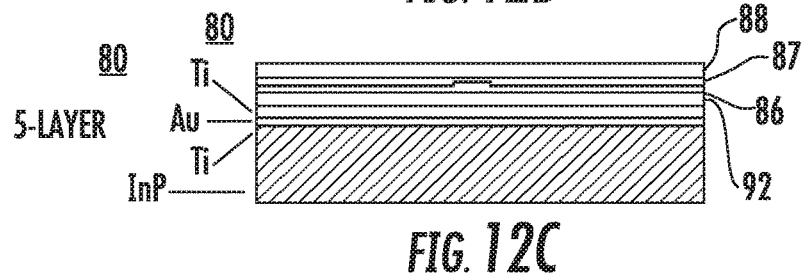

Referring additionally to FIGS. 12B and 12C, 4 and 5 layer ridge waveguides are illustrated, respectively. The 4-layer ridge waveguide illustrated in FIG. 12B is basically the same as the 3-layer ridge waveguide illustrated in FIG. 12A, except that an additional cladding layer 90 is deposited on the upper surface of cladding layer 88. The 5-layer ridge waveguide illustrated in FIG. 12C is basically the same as the 4-layer ridge waveguide illustrated in FIG. 12B, except that an additional cladding layer 92 is deposited on the metallization surface prior to the deposition of cladding layer 86, i.e. between metallization 85 and the previous bottom cladding layer 86. Additional cladding layers 92 and/or 90 may be added to enhance the characteristics of the cladding layers, allow the selection of a wider range of materials, further enhance the operation, etc.

Figure 13A:
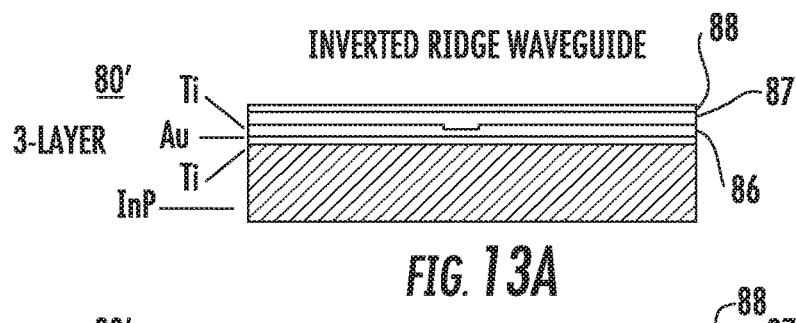
FIGS. 13A, 13B, and 13C illustrate a method of fabricating a polymer modulator using an inverted ridge waveguide with 3-layer stack, 4-layer stack, and 5-layer stack, respectively, on an InP platform, in accordance with the present invention.
Figure 13B:
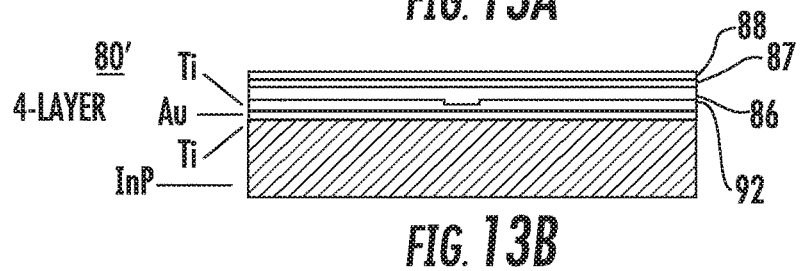
Figure 13C:
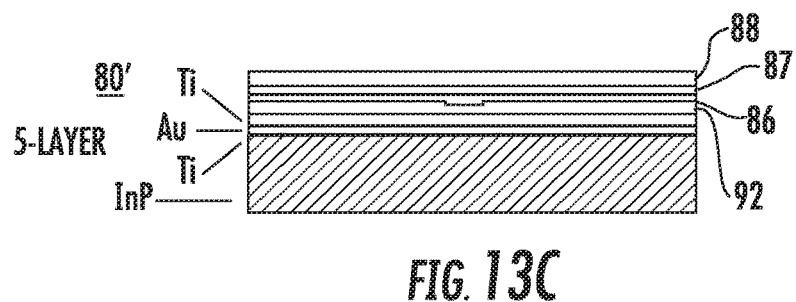

A modulator/waveguide 80' is illustrated in FIG. 13A, which is the same as modulator/waveguide 80 of FIG. 12A except that an inverted ridge and core are included. Modulator/waveguide 80' is referred to as an "inverted ridge waveguide". Referring additionally to FIGS. 13B and 13C, 4 and 5 layer inverted ridge waveguides are illustrated, respectively. The 4-layer inverted ridge waveguide illustrated in FIG. 13B is basically the same as the 3-layer inverted ridge waveguide illustrated in FIG. 13A, except that an additional cladding layer 90' is deposited on the upper surface of cladding layer 88'. The 5-layer inverted ridge waveguide illustrated in FIG. 13C is basically the same as the 4-layer inverted ridge waveguide illustrated in FIG. 13B, except that an additional cladding layer 92' is deposited on the metallization surface prior to the deposition of cladding layer 86', i.e. between metallization 85' and the previous bottom cladding layer 86'. Additional cladding layers 92' and/or 90' may be added to enhance the characteristics of the cladding layers, allow the selection of a wider range of materials, further enhance the operation, etc.

Figure 14:
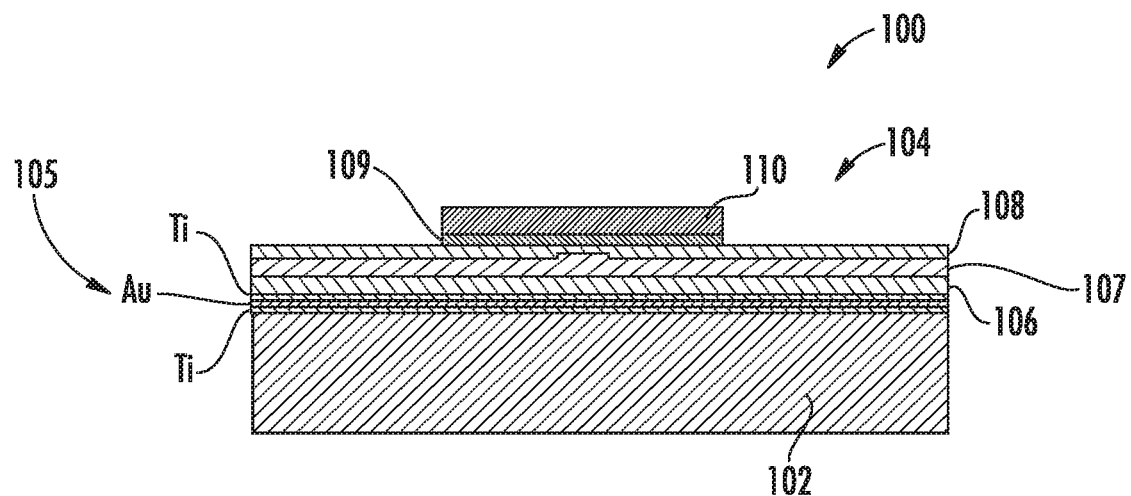
FIG. 14 illustrates a method of fabricating a polymer modulator using a ridge waveguide with 3-layer stack and bottom and top microstrip conductors on an InP platform, in accordance with the present invention.
Figure 15:
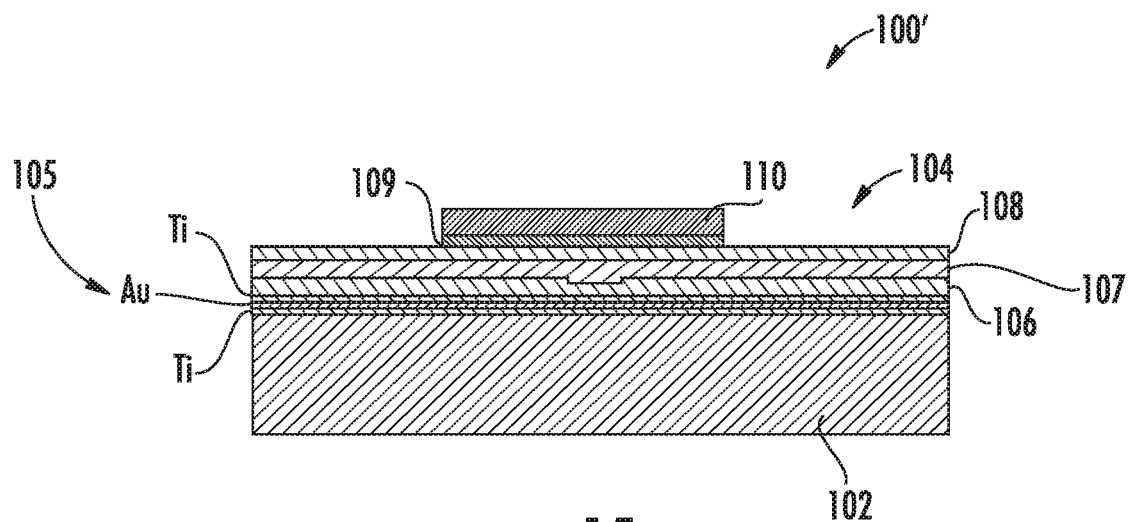
FIG. 15 illustrates a method of fabricating a polymer modulator using an inverted ridge waveguide with 3-layer stack and bottom and top microstrip conductors on an InP platform, in accordance with the present invention.

Turning now to FIG. 14, a direct drive polymer modulator (DDPM) 100 is illustrated in accordance with the present invention. DDPM 100 includes a 3-layer stack forming a ridge waveguide similar to the example illustrated in FIG. 12A with an InP platform/substrate 102 having a ridge waveguide 104 monolithically formed thereon. Ridge waveguide 104 may be fabricated using any convenient method for the specific application but the method described above using the etched trench is preferred for its simplicity and accuracy. In this specific example the first material deposited on the InP surface in the trench is a metallization 105, such as Au, Ti/Au, or Cr/Au, in this example sequential layers of Ti/Au/Ti are deposited. A bottom cladding layer 106 is deposited on metallization 105, a core 107 with upwardly directed ridge is deposited on bottom cladding layer 106, and a top cladding layer 108 is deposited on core 107. An electron blocking layer 109. Charge barriers can be composed of thinly deposited metal oxides such as titanium oxide, spin on glasses such as PDMS, organic materials such as BCB, Organo-silane compounds as well as polyvinylcarbazole. These materials provide an electrical charge barrier to reduce leakage in the device. One of these layers are deposited on the upper surface of top cladding layer 108 above the ridge formed in the core 107 and a top microstrip conductor 110 is deposited on the upper surface of electron blocking layer 109. In this specific example, metallization 105 acts as a microstrip bottom conductor and top microstrip conductor 110 completes the microstrip input. Thus, a simple and inexpensive microstrip input is conveniently integrated into the present inventive polymer modulator. Similarly, a direct drive polymer modulator (DDPM) 100' with inverted ridge waveguide and microstrip input is illustrated in FIG. 15.

Figure 16:
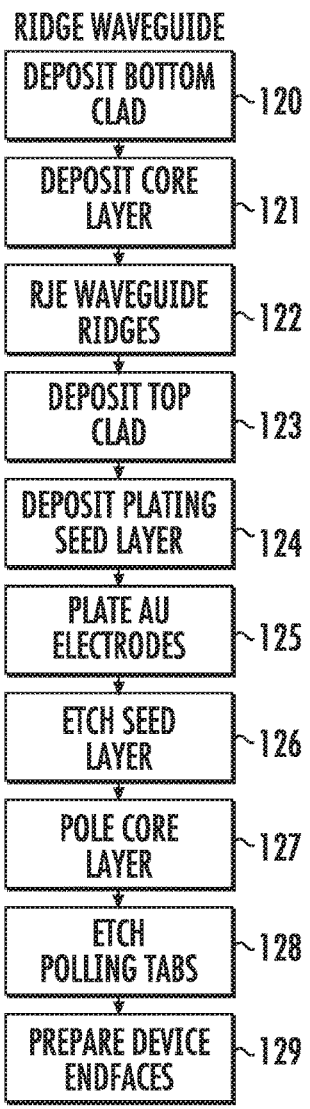
FIG. 16 illustrates steps in a method of fabricating direct drive polymer modulators using a ridge waveguide 3-layer stack.

Referring additionally to FIG. 16, a flow chart is illustrated showing a preferred process for the fabrication of ridge waveguides, such as ridge waveguide 80 illustrated in FIG. 12A. The process starts with a platform/substrate having, in this preferred embodiment a trench formed for the deposition of the ridge waveguide. The trench may also have a metallization on the bottom surface, or not. Starting with these features, in a first step 120 a bottom cladding layer is deposited. In a second step 121 a core layer is deposited. A third step 122 includes forming waveguide ridges, which in this preferred example includes reactive ion etching. A fourth step 123 consist of depositing a top cladding layer. A seed layer is plated on the upper surface of the structure, step five 124, and Au electrodes are plated on the seed layer, step six 125. The seed layer is etched to separate the Au electrodes, step seven 126, and the core is poled, step eight 137, using the Au electrodes to apply the proper field. In a step nine 128, the Au electrodes are removed by etching and in a final step 129 the waveguide is completed by preparing the endfaces as required by the specific type of device being fabricated.

Figure 17:
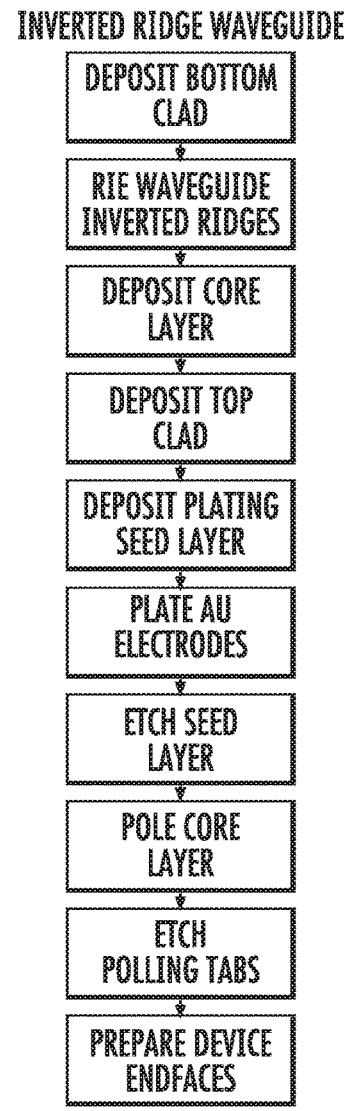
FIG. 17 illustrates steps in a method of fabricating direct drive polymer modulators using an inverted ridge waveguide 3-layer stack.

Referring additionally to FIG. 17, a flow chart is illustrated showing a preferred process for the fabrication of an inverted ridge waveguides, such as ridge waveguide 80' illustrated in FIG. 13A. All of the steps in the process of fabricating an inverted ridge waveguide are the same as those described above for a ridge waveguide, except that RIE waveguide inverted ridges are formed in the bottom cladding in a step preceding the deposition of the core layer.

Figure 18:
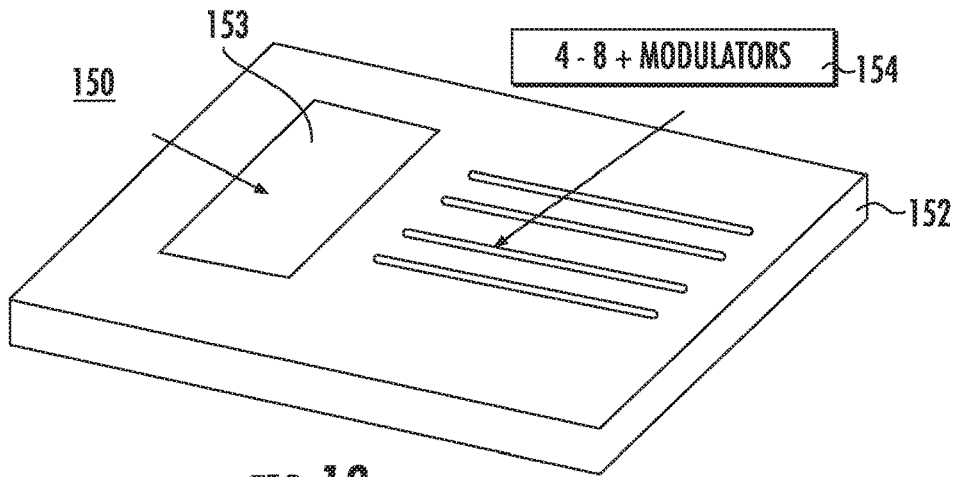
FIG. 18 is a simplified perspective view illustrating and array of lasers/polymer modulators on a semiconductor platform.

Referring now to FIG. 18, an example of multiple DDPM, designated 150, of the type described above are arrayed on a generic InP chip 152. The chip can be silicon based or an InP substrate may be deposited on the silicon and becomes the platform as used in the above descriptions. The various components may be fabricated in silicon or, as in this specific example the InP chip becomes the platform as used in the above descriptions. In the example illustrated, four monolithic lasers, designated 153, are formed in the InP platform/substrate. Four polymer modulators 154 are formed in the InP platform/substrate in optical alignment with the four lasers. While four laser/polymer modulator sets are illustrated in this example, it will be understood that to form a coarse wavelength division multiplexing (CWDM) transmitter chip, several lasers each of a different wavelength are formed on the InP chip and an array of, for example, polymer photonic (PP) modulators are fabricated to align one to each laser. The output guides could be directed to a multiplexer, for example an echelle grating or ring resonator array (not shown), and the output of the multiplexer could be coupled to an optical fiber. In this example, 4×25G modulators result in a 100G transmitter chip or 8×50G could be provided for a 400G transmitter chip.

Figure 19:
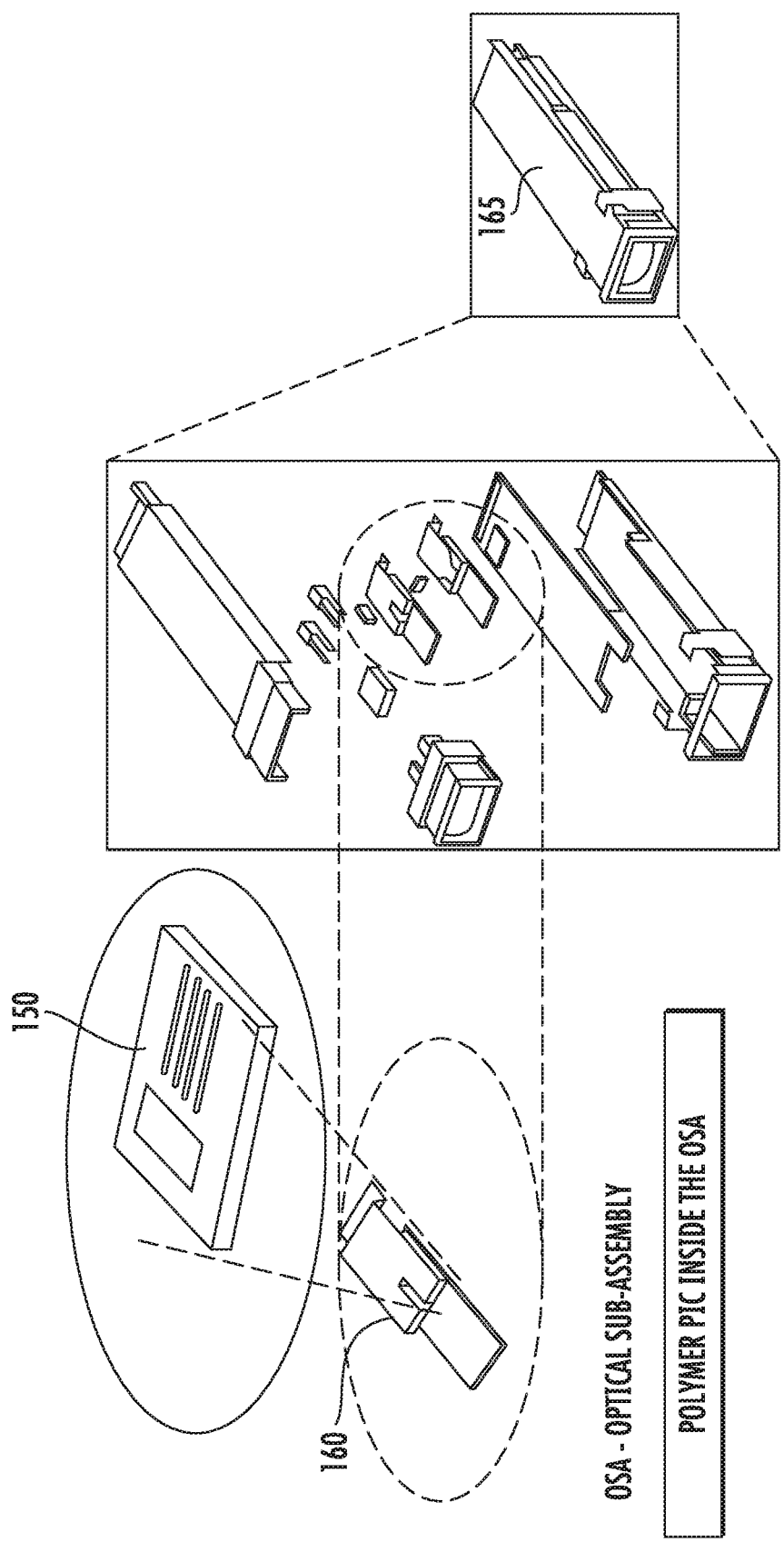
FIG. 19 is a simplified perspective view illustrating the array of lasers/polymer modulators of FIG. 18 assembled in a package module.

Referring additionally to FIG. 19, an example of a package for multiple DDPM 150 is illustrated. In this example, multiple DDPM 150 is mounted in an optical subassembly 160. Optical subassembly 160 is then mounted in a package module 165 designed around optical subassembly 160.

Thus, a new and improved laser and polymer modulator integrated on a common platform and optically coupled and aligned is disclosed. The laser and polymer modulator are integrated on a common platform with novel new design and process. The laser and polymer modulator are integrated on a common platform with more efficient coupling between source laser and optical modulator, efficient 3-layer polymer modulators, higher performance (multi GHz), and very low voltage to allow direct drive without the use of a driver circuit.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A monolithic photonic integrated circuit comprising:
   a platform formed of InP;
   a monolithic InP laser formed in/on the platform; and
   an electro-optic polymer modulator monolithically built onto the platform and optically coupled to the monolithic laser, the polymer modulator being optically coupled to the monolithic laser by waveguides including multilayer polymer waveguides with an electro-optic (EO) polymer core and top and bottom EO polymer cladding layers and the EO polymer core has an EO coefficient ($r_{33}$) greater than 250 pm/V, a Tg 150° C. to 200° C. and a resistivity approximately $10^8$ Ohm-cm, and the top and bottom EO polymer cladding layers have a Tg approximately the same as the Tg of the EO polymer core, where Tg is the glass transition temperature, and a resistivity, at room temperature, greater than approximately $10^8$ Ohm-cm, and a resistivity much less than the resistivity of the EO polymer core at poling temperature, and the top and bottom EO polymer cladding layers have levels of conductivity equal to or higher than the EO polymer core.

2. The monolithic photonic integrated circuit as claimed in claim 1 wherein the monolithic laser includes one of a distributed feedback laser, a Fabry-Perot laser, a distributed Bragg reflector laser, or a tunable laser.

3. The monolithic photonic integrated circuit as claimed in claim 1 wherein the polymer modulator includes a Mach-Zehnder interferometer type modulator.

4. The monolithic photonic integrated circuit as claimed in claim 1 wherein the polymer modulator is optically coupled to the monolithic laser by one of free space, polymer waveguides, or semiconductor material waveguides.

5. The monolithic photonic integrated circuit as claimed in claim 4 wherein the polymer modulator is optically coupled to the monolithic laser by waveguides including InP waveguides.

6. The monolithic photonic integrated circuit as claimed in claim 1 wherein the polymer modulator is optically coupled to the monolithic laser by waveguides including one of 3-layer, 4-layer and 5-layer polymer waveguides.

7. The monolithic photonic integrated circuit as claimed in claim 1 wherein the polymer modulator is a Mach-Zehnder interferometer modulator optically coupled to the monolithic laser by waveguides including one of Y-splitters/combiners and MMI splitters/combiners.

8. The monolithic photonic integrated circuit as claimed in claim 1 wherein the polymer modulator is a direct drive electro-optic polymer modulator.

9. The monolithic photonic integrated circuit as claimed in claim 1 wherein the multilayer polymer waveguides have a propagation loss less than 2.2 dB/cm with device insertion loss less than 6 dB.

10. The monolithic photonic integrated circuit as claimed in claim 1 wherein the polymer modulator and multilayer polymer waveguides include one of a ridge waveguide and an inverted ridge waveguide.

11. A monolithic photonic integrated circuit comprising:
    a platform;
    a monolithic laser formed in/on the platform;

an electro-optic polymer modulator monolithically built onto the platform and optically coupled to the monolithic laser by waveguides including electro-optic polymer waveguides, the electro-optic polymer modulator and the electro-optic polymer waveguides including an electro-optic polymer core and top and bottom electro-optic polymer cladding layers, the electro-optic polymer core having an electro-optic coefficient ($r_{33}$) greater than 250 pm/V, and a Tg 150° C. to 200° C., and the top and bottom electro-optic polymer cladding layers having a Tg approximately the same as the Tg of the electro-optic polymer core, where Tg is the glass transition temperature.

12. The monolithic photonic integrated circuit as claimed in claim 11 wherein the platform includes InP.

13. The monolithic photonic integrated circuit as claimed in claim 12 wherein the electro-optic polymer modulator and the electro-optic polymer waveguides include InP.

14. The monolithic photonic integrated circuit as claimed in claim 11 wherein the electro-optic polymer modulator and the electro-optic polymer waveguides include metallization on a surface of the platform underlying the bottom electro-optic polymer cladding layers.

15. The monolithic photonic integrated circuit as claimed in claim 14 wherein the metallization on the surface of the platform underlying the bottom electro-optic polymer cladding layers includes one of Au, Ti/Au, Cr/Au, or Ti/Au/Ti.

16. The monolithic photonic integrated circuit as claimed in claim 14 further including a top microstrip conductor overlying at least a portion of the electro-optic polymer modulator.

17. The monolithic photonic integrated circuit as claimed in claim 14 further including an electron blocking layer sandwiched between the top electro-optic polymer cladding layer and the top microstrip conductor overlying at least the portion of the electro-optic polymer modulator.

18. The monolithic photonic integrated circuit as claimed in claim 11 wherein the electro-optic polymer waveguides have a propagation loss less than 2.2 dB/cm with device insertion loss less than 6 dB.

19. The monolithic photonic integrated circuit as claimed in claim 11 wherein the polymer modulator and electro-optic polymer waveguides include one of a ridge waveguide and an inverted ridge waveguide.

20. The monolithic photonic integrated circuit as claimed in claim 11 wherein the polymer modulator is a Mach-Zehnder interferometer modulator optically coupled to the monolithic laser by waveguides including one of splitters/combiners/MMI.

21. The monolithic photonic integrated circuit as claimed in claim 11 wherein the electro-optic polymer modulator is a direct drive electro-optic polymer modulator with a drive voltage of approximately 0.5V.

22. A method of fabricating a monolithic photonic integrated circuit comprising the steps of:
providing a platform;
integrating a monolithic laser in/on the platform, the monolithic laser including one of a distributed feedback laser, a Fabry-Perot laser, a distributed Bragg reflector laser, or a tunable laser; and
monolithically forming an electro-optic polymer modulator on the platform and optically coupling the electro-optic polymer modulator to the monolithic laser by waveguides including electro-optic polymer waveguides, forming the electro-optic polymer modulator and the electro-optic polymer waveguides with an electro-optic polymer core and top and bottom electro-optic polymer cladding layers, and forming the electro-optic polymer core from materials having an electro-optic coefficient ($r_{33}$) greater than 250 pm/v, and a Tg 150° C. to >200° C., and forming the top and bottom electro-optic polymer cladding layers from materials having a Tg approximately the same as the Tg of the electro-optic polymer core.

23. The method of fabricating a monolithic photonic integrated circuit as claimed in claim 22 wherein the step of monolithically forming the electro-optic polymer modulator on the platform and optically coupling the electro-optic polymer modulator to the monolithic laser by waveguides includes etching a trench in the platform and depositing sequential layers of electro-optic material defining the bottom electro-optic polymer cladding layer, the electro-optic polymer core and the top electro-optic polymer cladding layers.

24. The method of fabricating a monolithic photonic integrated circuit as claimed in claim 23 wherein the step of monolithically forming the electro-optic polymer modulator on the platform and optically coupling the electro-optic polymer modulator to the monolithic laser by waveguides further includes depositing metallization in the trench prior to depositing the sequential layers of electro-optic material.

25. The method of fabricating a monolithic photonic integrated circuit as claimed in claim 24 wherein the step of depositing metallization in the trench prior to depositing the sequential layers of electro-optic material further includes depositing one of Au, Ti/Au, Cr/Au, or Ti/Au/Ti.

26. The method of fabricating a monolithic photonic integrated circuit as claimed in claim 24 further including a step of depositing a top microstrip conductor overlying at least a portion of the electro-optic polymer modulator and an electron blocking layer sandwiched between the top electro-optic polymer cladding layer and the top microstrip conductor overlying at least the portion of the electro-optic polymer modulator.

27. The method of fabricating a monolithic photonic integrated circuit as claimed in claim 22 wherein the step of monolithically forming an electro-optic polymer modulator includes incorporating one of a ridge waveguide and an inverted ridge waveguide into the electro-optic polymer modulator.

28. The method of fabricating a monolithic photonic integrated circuit as claimed in claim 22 wherein the step of monolithically forming an electro-optic polymer modulator includes forming a Mach-Zehnder interferometer modulator and optically coupling the Mach-Zehnder interferometer modulator to the monolithic laser by waveguides including one of splitters/combiners/MMI.

29. The method of fabricating a monolithic photonic integrated circuit as claimed in claim 22 wherein the step of integrating the monolithic laser in/on the platform includes integrating 4-8 monolithic lasers each of a different wavelength in/on the platform and the step of monolithically forming the electro-optic polymer modulator on the platform and optically coupling the electro-optic polymer modulator to the monolithic laser includes monolithically forming 4-8 electro-optic polymer modulators on the platform and optically coupling the electro-optic polymer modulators to the 4-8 monolithic lasers, one each, to form a CWDM transmitter chip.

30. The method of fabricating a monolithic photonic integrated circuit as claimed in claim 22 wherein the step of monolithically forming the electro-optic polymer modulator on the platform includes forming a direct drive electro-optic polymer modulator with a drive voltage of approximately 0.5V.

* * * * *